(12) United States Patent
Green et al.

(10) Patent No.: US 9,871,107 B2
(45) Date of Patent: Jan. 16, 2018

(54) DEVICE WITH A CONDUCTIVE FEATURE FORMED OVER A CAVITY AND METHOD THEREFOR

(71) Applicant: FREESCALE SEMICONDUCTOR, INC., Austin, TX (US)

(72) Inventors: Bruce M. Green, Gilbert, AZ (US); Jenn Hwa Huang, Chandler, AZ (US); Vikas S. Shilimkar, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/719,999

(22) Filed: May 22, 2015

(65) Prior Publication Data
US 2016/0343809 A1 Nov. 24, 2016

(51) Int. Cl.
*H01L 23/48* (2006.01)
*H01L 21/768* (2006.01)
(Continued)

(52) U.S. Cl.
CPC .... *H01L 29/2003* (2013.01); *H01L 21/30621* (2013.01); *H01L 21/76224* (2013.01);
(Continued)

(58) Field of Classification Search
CPC ........... H01L 29/2003; H01L 29/66522; H01L 29/66462; H01L 29/78; H01L 21/30621;
(Continued)

(56) References Cited

U.S. PATENT DOCUMENTS 5,177,669 A 1/1993 Juskey et al.
5,371,404 A 12/1994 Juskey et al.
(Continued)

FOREIGN PATENT DOCUMENTS

CN 103824755 5/2014
EP 1513170 B1 9/2014
(Continued)

OTHER PUBLICATIONS

Extended European Search Report for Patent Appln. No. 16162063.8 (dated Aug. 19, 2016).
(Continued)

*Primary Examiner* — Sue A Purvis
*Assistant Examiner* — Thai T Vuong
(74) *Attorney, Agent, or Firm* — Bruce M. Green

(57) ABSTRACT

An embodiment of a device includes a semiconductor substrate, a transistor formed at the first substrate surface, a first conductive feature formed over the first substrate surface and electrically coupled to the transistor, and a second conductive feature covering only a portion of the second substrate surface to define a first conductor-less region. A cavity vertically aligned with the first conductive feature within the first conductor-less region extends into the semiconductor substrate. A dielectric medium may be disposed within the cavity and have a dielectric constant less than a dielectric constant of the semiconductor substrate. A method for forming the device may include forming a semiconductor substrate, forming a transistor on the semiconductor substrate, forming the first conductive feature, forming the second conductive feature, forming the conductor-less region, forming the cavity, and filling the cavity with the dielectric medium.

15 Claims, 24 Drawing Sheets

(51) Int. Cl.

| | | |
|---|---|---|
| *H01L 21/70* | (2006.01) | |
| *H01L 29/778* | (2006.01) | |
| *H01L 29/20* | (2006.01) | |
| *H01L 23/66* | (2006.01) | |
| *H01L 23/522* | (2006.01) | |
| *H01L 29/66* | (2006.01) | |
| *H01L 21/306* | (2006.01) | |
| *H01L 21/762* | (2006.01) | |
| *H01L 29/417* | (2006.01) | |
| *H01L 49/02* | (2006.01) | |
| *H01L 29/06* | (2006.01) | |

(52) U.S. Cl.
CPC ........ *H01L 23/481* (2013.01); *H01L 23/5227* (2013.01); *H01L 23/66* (2013.01); *H01L 29/66462* (2013.01); *H01L 29/7787* (2013.01); *H01L 28/10* (2013.01); *H01L 29/0657* (2013.01); *H01L 29/4175* (2013.01); *H01L 2223/6605* (2013.01)

(58) Field of Classification Search
CPC ............... H01L 29/205; H01L 23/5227; H01L 29/0649; H01L 29/7787; H01L 21/76224
USPC .................................................. 257/76, 678
See application file for complete search history.

(56) References Cited

U.S. PATENT DOCUMENTS

| | | |
|---|---|---|
| 5,776,798 A | 7/1998 | Quan et al. |
| 6,057,175 A | 5/2000 | Milla et al. |
| 6,228,676 B1 | 5/2001 | Glenn et al. |
| 6,287,931 B1 | 9/2001 | Chen |
| 6,310,386 B1 | 10/2001 | Shenoy |
| 6,455,393 B1 | 9/2002 | Swanson |
| 6,611,002 B2 | 8/2003 | Weeks et al. |
| 6,727,778 B2 | 4/2004 | Kudrle et al. |
| 6,759,275 B1 | 7/2004 | Lee et al. |
| 6,806,552 B2 | 10/2004 | Woo et al. |
| 7,118,988 B2 | 10/2006 | Buerger, Jr. et al. |
| 7,255,001 B1 | 8/2007 | Davis et al. |
| 7,452,806 B2 | 11/2008 | Hwang et al. |
| 7,723,224 B2 | 5/2010 | Hill et al. |
| 7,795,126 B2 | 9/2010 | Prabhu et al. |
| 7,808,798 B2 | 10/2010 | Cotte et al. |
| 7,973,629 B2 | 7/2011 | Lin et al. |
| 8,013,437 B1 | 9/2011 | Sirinorakul et al. |
| 8,304,271 B2 | 11/2012 | Huang et al. |
| 8,324,692 B2 | 12/2012 | Chen et al. |
| 2004/0080028 A1 | 4/2004 | Yanagisawa |
| 2005/0269668 A1 | 12/2005 | Zhang |
| 2005/0287707 A1 | 12/2005 | Lin et al. |
| 2006/0181385 A1 | 8/2006 | Hurley |
| 2008/0042236 A1 | 2/2008 | Seah |
| 2008/0096325 A1 | 4/2008 | Kao et al. |
| 2009/0230537 A1 | 9/2009 | Liu et al. |
| 2009/0267218 A1 | 10/2009 | Gupta et al. |
| 2010/0065950 A1 | 3/2010 | Lowry et al. |
| 2010/0248676 A1* | 9/2010 | Takahashi ............. H01L 29/205 455/341 |
| 2010/0279470 A1 | 11/2010 | Grey |
| 2010/0283130 A1* | 11/2010 | Nishio ............... H01L 21/76898 257/621 |
| 2010/0295100 A1* | 11/2010 | Huang ................ H01L 29/2003 257/256 |
| 2010/0327432 A1 | 12/2010 | Sirinorakul et al. |
| 2011/0254165 A1* | 10/2011 | Muranaka ......... H01L 21/76832 257/751 |
| 2012/0037969 A1 | 2/2012 | Sanders et al. |
| 2012/0112661 A1 | 5/2012 | Van De Ven et al. |
| 2012/0273873 A1 | 11/2012 | Grey |
| 2012/0292757 A1* | 11/2012 | Mauder ................ H01L 23/481 257/698 |
| 2013/0037917 A1 | 2/2013 | Xue |
| 2013/0292849 A1 | 11/2013 | Lin et al. |
| 2014/0287703 A1 | 9/2014 | Herbsommer et al. |
| 2014/0332980 A1 | 11/2014 | Sanders et al. |
| 2015/0097200 A1 | 4/2015 | Bergmann et al. |

FOREIGN PATENT DOCUMENTS

| | | |
|---|---|---|
| JP | 57-107063 A | 7/1982 |
| JP | 11274412 | 10/1999 |
| JP | 2000040789 | 2/2000 |
| JP | 2008-141140 A | 6/2008 |

OTHER PUBLICATIONS

Giry, A. et al. "A monolithic watt-level SOI LDMOS linear power amplifier with through silicon via for 4G cellular applications", IEEE Topical Conference on Power Amplifiers for Wireless and Radio Applications (PAWR),19-21 pgs. (2013).

Liao, H. Y. et al. "RF Model and Verification of Through-Silicon Vias in Fully Integrated SiGe Power Amplifier", IEEE Electron Device Letters, vol. 32, No. 6, 809-811 pgs, (Jun. 2011).

Tsay J. et al. "A differential SiGe power amplifier using through-silicon-via and envelope-tracking for broadband wireless applications", IEEE Bipolar/BiCMOS Circuits and Technology Meeting (BCTM), 147-150 pgs. (2014).

Wu, R. "High-Efficiency Silicon-Based Envelope-Tracking Power Amplifier Design With Envelope Shaping for Broadband Wireless Applications", IEEE Journal of Solid-State Circuits, vol. 48, No. 9, 2030-2040 pgs. (Sep. 2013).

Joseph, A. J. et al. "Through-silicon vias enable next-generation SiGe power amplifiers for wireless communications", IBM Journal of Research and Development, vol. 52, No. 6, 635-648 pgs. (Nov. 2008).

Chen J. et al. "On-Chip Spiral Inductors for RF Applications: An Overview", Journal of Semiconductor Technology and Science, vol. 4, No. 3, 149-167 pgs (Sep. 2004).

Chang et al, "Large Suspended Inductors on Silicon and Their Use in a 2-μm CMOS RF Amplifier", IEEE Electron Device Letters, May 1993, pp. 246-248, vol. 14, No. 5.

Korndorfer et al, "Simulation and Measurement of Back Side Etched Inductors", Proceedings of the 5th European Microwave Integrated Circuits Conference, 2010, pp. 389-392.

Robertson et al, "Micromachined W-Band Filters", IEEE Transactions on Microwave Theory and Techniques, Apr. 1996, pp. 598-606, vol. 44.

Lee, "A >400 GHz f max Transferred-Substrate Heterojunction Bipolar Transistor IC Technology", IEEE Electron Device Letters, Mar. 1998, pp. 77-79, vol. 19, No. 3.

Campbell, "A Wideband Power Amplifier MMIC Utilizing GaN on SiC HEMT Technology", IEEE Journal of Solid State Circuits, Oct. 2009, pp. 2640-2647, vol. 44, No. 10.

Mensa, "Baseband Amplifiers in Transferred-Substrate HBT Technology", Gallium Arsenide Integrated Circuit (GaAsIC) Symposium Technical Digest, Nov. 1-4, 1998, pp. 33-36, Atlanta, GA.

U.S. Appl. No. 14/666,999, filed Mar. 24, 2015.

Hill et al, "Three-Dimensional MMIC Architecture Using Low Thermal Impedance Technology", IEEE MTT-S International Microwave Symposium Digest, Jun. 7-12, 1998, pp. 699-702, vol. 2.

Chavez et al, Novel Suspended-Line Microstrip Coupler Using BCB As Supporting Layer, Microwave and Optical Technology Letters, Aug. 8, 2007, pp. 1813-1814, vol. 49, No. 8.

Costanzo et al, "Millimeter-Waves Structures on Benzocyclobutene Dielectric Substrate", Radioengineering, Dec. 2011, pp. 785-789, vol. 20, No. 4.

Notice of Allowance dated Jun. 15, 2016 for U.S. Appl. No. 14/832,525, 6 pages.

Non-Final Rejection dated Jun. 9, 2016 for U.S. Appl. No. 14/862,944, 11 pages.

Notice of Allowance dated Apr. 21, 2017 for U.S. Appl. No. 14/666,999 7 pages.

(56) References Cited

OTHER PUBLICATIONS

Notice of Allowance dated Apr. 25, 2017 for U.S. Appl. No. 14/862,944 5 pages.
Notice of Allowance dated Aug. 1, 2017 for U.S. Appl. No. 14/862,944 6 pages.
Requirement for Restriction dated Apr. 14, 2016 for U.S. Appl. No. 14/862,944, 7 pages.
Yue, C.P. et al. "On-chip spiral inductors with patterned ground shields for Si-based RF Ics", IEEE Journal of Solid-State Circuits, vol. 33, No. 5, pp. 743-752 (May 1998).
Extended European Search Report for Patent Appln. No. 16182864.5 (dated Jan. 19, 2017).
Notice of Allowance dated Nov. 14, 2016 for U.S. Appl. No. 14/862,944, 12 pages.
Non-Final Rejection dated Nov. 9, 2016 for U.S. Appl. No. 14/666,999, 6 pages.
Notice of Allowance dated Aug. 12, 2016 for U.S. Appl. No. 14/832,525, 7 pages.

\* cited by examiner

DEVICE WITH A CONDUCTIVE FEATURE FORMED OVER A CAVITY AND METHOD THEREFOR

TECHNICAL FIELD

Embodiments of the subject matter described herein relate generally to devices for radio-frequency (RF) applications.

BACKGROUND

Gallium nitride (GaN) RF power transistors provide 2-3 times higher output impedance and power density than their silicon (Si) counterparts. GaN on Si technology is desired for lower cost, high performance RF applications. However, GaN on Si technology requires increasingly thin substrates (e.g., 50 microns or less) to effectively dissipate heat generated in GaN transistors. At the same time, applications demand integrated passive devices (IPDs) and higher levels of integration to lower assembly cost. Thinner substrates lower the quality factor (Q) of passive components (e.g., inductors, transmission lines) and further reduce characteristic impedance of transmission lines in IPDs. Lower Q passive components result in higher overall system losses. In addition, high impedance transmission lines are needed for many applications such as inductive components, bias networks, and distributed amplifiers, among others. However, thinner Si substrates drive the need to make transmission line traces narrower to realize a transmission line of desired impedance. The narrower traces limit the maximum realizable impedance for a GaN on Si process technology. In addition, electro-migration effects limit the use of these narrow, high impedance transmission lines. This electro-migration limit may limit the current-carrying capability of these transmission lines to between 2 and 10 milliamps per millimeter of conductor width, depending on the metal used and thickness of the line. Therefore, power efficient and high performance designs desire higher Q passive components such as inductors and higher impedance transmission lines for GaN on Si devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
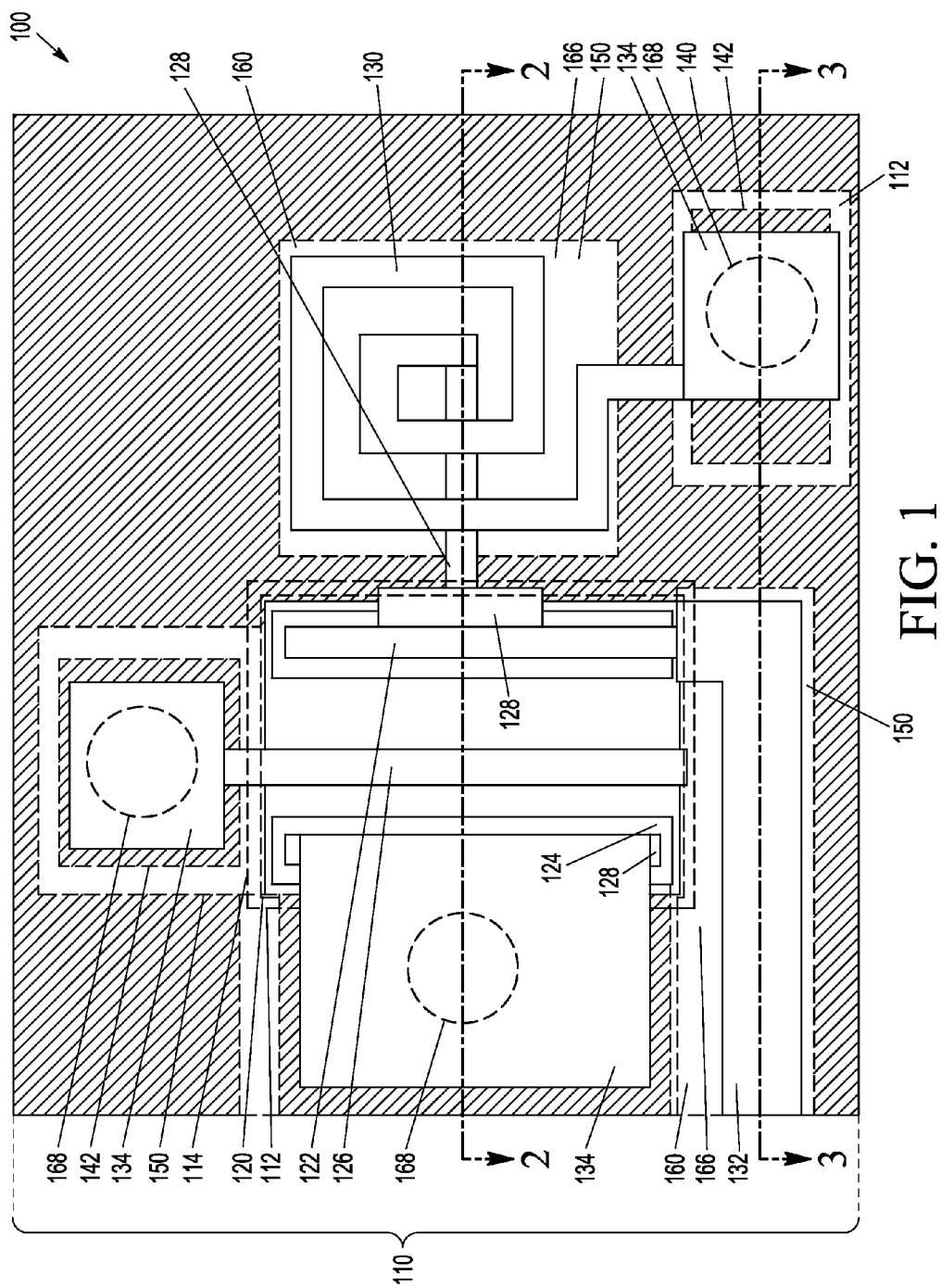
FIG. 1 is a top view of a device in accordance with an embodiment.

FIG. 1 is a top view of an exemplary device 100 in accordance with an embodiment. In an embodiment, device 100 includes a semiconductor substrate 110, one or more transistor(s) 120, one or more first conductive feature(s) (e.g. inductor 130, transmission line 132, and/or top interconnect structures 134), one or more second conductive feature(s) 140 (e.g. back metal 140 and/or backside contact 142), one or more first conductor-less region(s) 150 and one or more cavities 160 below one or more of the first conductor-less region(s) 160 and aligned with corresponding first conductive feature(s) 130, 132. As used herein, a "first conductive feature" refers to a conductive structure formed on or over the top substrate surface 219 of FIG. 2, and a "second conductive feature" refers to a conductive structure formed on or over the bottom substrate surface 210 of FIG. 2.

For clarity of illustration, although they would be hidden in the top view, back metal 140 and backside contacts 142 are depicted in the top view of FIG. 1 as cross-hatched regions having boundaries defined with dashed lines. Similarly, cavities 160 and through wafer vias 168 also would be hidden in the top view, and thus the boundaries of cavities 160 and through wafer vias 168 also are indicated with dashed lines. Further, although device 100 is shown to include two cavities 160, other device embodiments may include more or fewer cavities, and/or the cavities may be located in different portions of the device than those depicted in FIGS. 1-4. It should be appreciated that the description of device 100 and arrangement and connection of its elements such as transistor 120, first and second conductive features 130, 132, 134, 140, and 142, conductor-less region(s) 150, cavities 160, and through wafer vias 168 are exemplary and are not intended to limit the scope of the inventive subject matter only to the illustrated embodiments.

Figure 2:
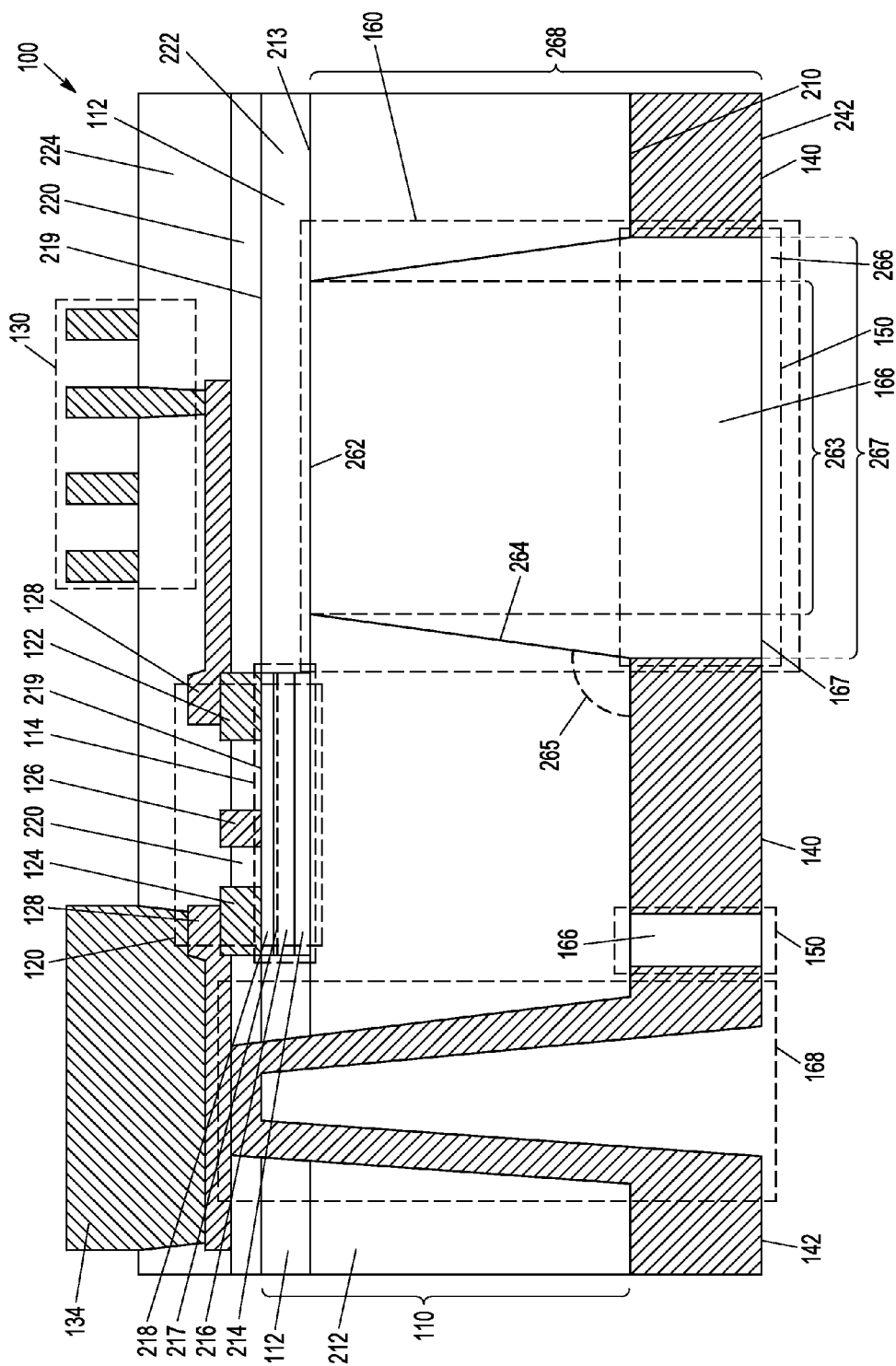
FIG. 2 is a cross sectional view of the device of FIG. 1 along line 2-2, in accordance with an embodiment.
Figure 3:
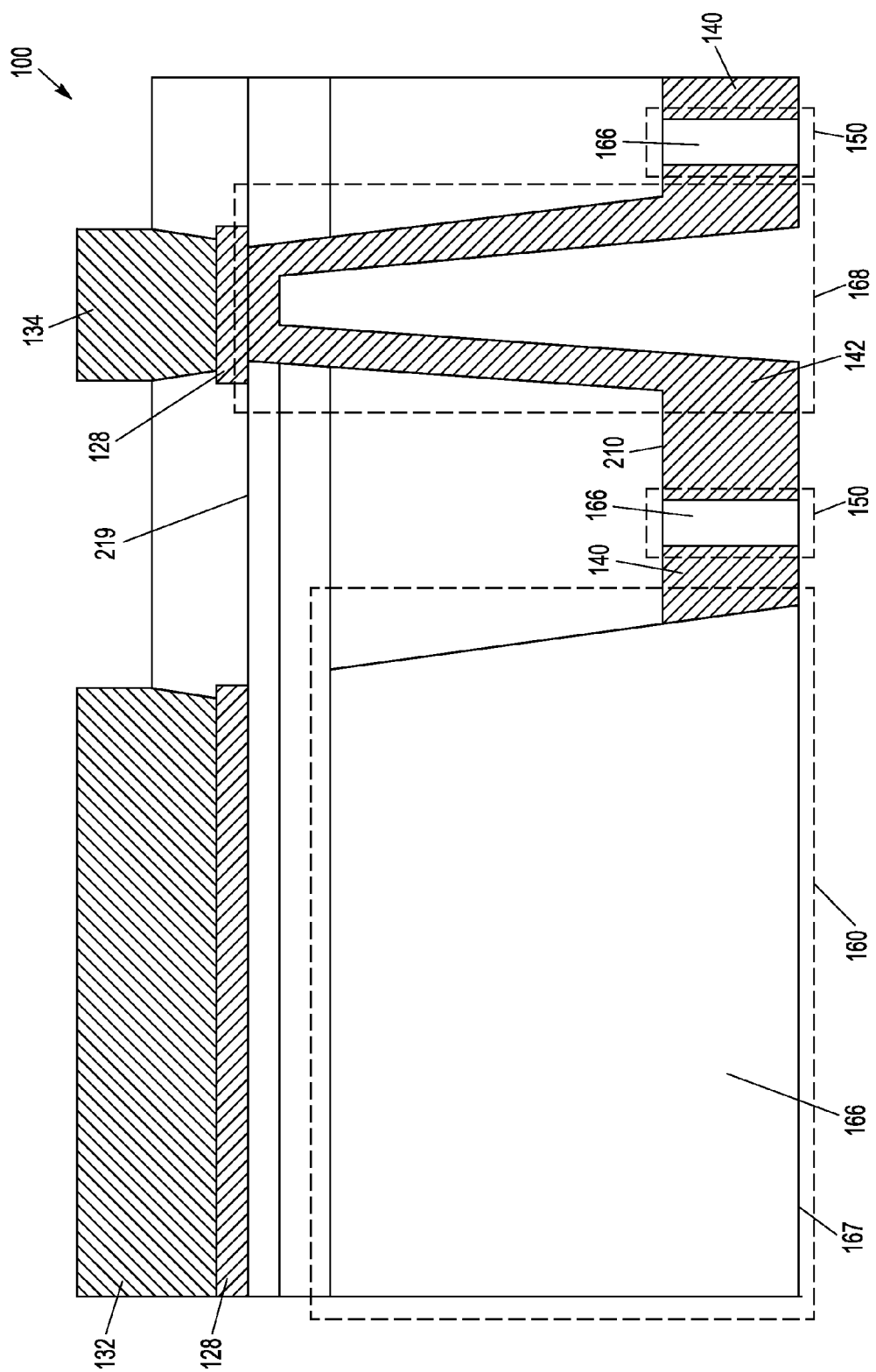
FIG. 3 is a cross sectional view of the device of FIG. 1 along line 3-3, in accordance with an embodiment.

In an embodiment, and referring also to FIGS. 2 and 3, which are cross sectional views of the device of FIG. 1 along lines 2-2 and 3-3, respectively, semiconductor substrate 110 includes a top substrate surface 219 and a bottom substrate surface 210. Semiconductor substrate 110 may include one of silicon, germanium (Ge), gallium arsenide (GaAs), indium phosphide (InP), sapphire, diamond, gallium nitride (GaN), silicon carbide (SiC), glass, metal, or other appropriate metal, insulator, or semiconductor. According to an embodiment, and as will be explained more fully in connection with FIG. 2, semiconductor substrate 110 includes isolation region(s) 112 that separate the one or more active areas 114 that may contain transistor(s) 120 from other nearby active area(s), thus isolating individual transistors 120 from one another. As will be detailed further in the descriptions of FIG. 11 and method step 1100, isolation region(s) 112 may be created by etching or ion bombardment of portions of the top surface 219 of the semiconductor substrate 110, or other suitable technique(s).

Transistor 120 is the chief active component in device 100. Transistor 120 includes first and second current-conducting electrodes, where the current-conducting electrodes are spatially and electrically separated by a variable conductivity channel. For example, transistor 120 may comprise one or more field effect transistor(s) including but not limited to metal-oxide semiconductor transistors (MOSFET's), metal-semiconductor field effect transistors (MESFET's), high electron-mobility transistors (HEMT's), lateral-diffused metal-oxide semiconductor transistors (LDMOS), or other suitable field effect transistors (FETs) or bipolar junction transistors (BJT's). In FET embodiments, transistor 120 may include a drain (first current-conducting electrode), a source (second current-conducting element), and a gate (control electrode). In other embodiments, transistor 120 may include bipolar junction transistors (BJT's), heterojunction bipolar transistors (HBT's), or other suitable bipolar transistors. Descriptions denoted "drain", "source," and "gate" herein do not limit the inventive subject matter to FETs, as the drain, source, and gate of a FET are analogous to the collector, emitter, and base of a bipolar transistor.

According to an embodiment and when implemented as a FET, transistor 120 includes a plurality of electrodes that include a drain electrode 122 (first current-conducting electrode), a source electrode 124 (second current-conducting electrode), and a gate electrode 126 (control electrode). Drain electrode 122 and source electrode 124 are formed over semiconductor substrate 110 within active region 114. Device 100 also includes interconnect metallization 128 or other appropriate conductors that electrically couple drain electrode 122, source electrode 124, and gate electrode 126 to electrical circuit nodes in circuitry that is electrically coupled to transistor 120.

According to an embodiment, one or more inductors 130 and/or transmission lines 132 (first conductive features) are formed over semiconductor substrate 110 and may be electrically coupled to at least one of drain electrode 122, source electrode 124, or gate electrode 126. In an embodiment, inductor 130 may comprise a rectangular spiral inductor or a round spiral inductor, a meandering or serpentine inductor (not shown), or a combination of these or other types of inductors. A first conductive feature also may include a transmission line 132, according to an embodiment. In an embodiment, transmission line 132 may include but is not limited to a microstrip transmission line, a stripline transmission line (not shown), a coplanar waveguide (CPW) transmission line (not shown), a CPW transmission line with a finite ground plane, or other planar suitable transmission line structures. Descriptions denoted "inductor," "transmission line," and "top interconnect structure" in connection with the term "first conductive feature" 130, 132, 134 do not limit the inventive subject matter only to inductors, transmission lines, and conductive pads. It should be appreciated that, without departing from the inventive subject matter, in other embodiments, a "first conductive feature" may include other types of conductive and/or passive elements including, but not limited to, microwave couplers, branch-line combiners, power combiners, power splitters, Lange couplers, high-pass filters, low-pass filters, band-pass filters, spiral baluns, Marchand baluns, impedance transformers, passive matching networks, antennas, bond wires, or other passive microwave structures. Conductive features such as inductor 130 and transmission line 132 may be electrically coupled to transistor 120 using first interconnect metal 128. In addition, and according to an embodiment, top interconnect structure(s) 134 may be formed using the same or different metal layer(s) as inductor 130 and transmission line 132 to create conductive structures, for example, but not limited to traces, pads, and other features used to electrically couple electrical signals from inductor 130 and/or transmission line 132 to back metal 140 and backside contact 142 (e.g., using through wafer vias 168).

In an embodiment, "second conductive features", herein referred to as back metal 140 and backside contact 142, are coupled to bottom substrate surface 210 as shown in FIG. 2. It should be appreciated that references to "second conductive feature" denoted "back metal" and "backside contact" do not limit the inventive subject matter and in other embodiments (not shown), a "second conductive feature" may include other conductive electrical structures such as but not limited to inductors, couplers, transmission lines, antennas, baluns, bond wires, and other passive electrical or microwave structures that are coupled to the bottom substrate surface 210.

According to an embodiment, one or more first conductor-less region(s) 150 may be formed within the metal layer(s) used to create back metal 140 and backside contact 142 and the conductor-less region(s) 150 may be used to electrically isolate these conductive structures from one another. As used herein, the term "conductor-less region" means a region across a surface (e.g., bottom substrate surface 210) that lacks any conductive material, particularly conductive material that electrically couples opposite sides of such a region. In an embodiment, first conductor-less region 150 may be aligned (in the vertical direction in FIGS. 2 and 3) with one or more first conductive features (e.g. inductor 130, as shown in FIG. 2, and/or transmission line 132, as shown in FIG. 3). In other embodiments (not shown), first conductor-less region(s) 150 may be used to electrically isolate other conductive electrical structures formed over the bottom substrate surface 210, such as but not limited to inductors, couplers, transmission lines, antennas, baluns, bond wires, and other passive electrical or microwave structures formed as part of the second conductive feature from one another.

In an embodiment, and as will be explained more fully in connection with FIGS. 2 and 3, one or more cavities 160 are aligned, in the vertical direction, with one or more first conductor-less region(s) 150, where each cavity 160 extends into semiconductor substrate 110 from the bottom substrate surface 210 toward or to the top substrate surface 219. In some embodiments, each cavity 160 may be self-aligned with a first conductor-less region 150. Also, as will be explained more fully in FIGS. 2 and 3, each cavity 160 may be formed underneath one or more process layers overlying the top surface 219 of semiconductor substrate 110 and/or semiconductor layers within semiconductor substrate 110. In an embodiment, each cavity 160 may be aligned in the vertical direction with and completely overlap a first conductive feature 130, 132. In other embodiments (not shown), a cavity 160 may partially overlap a first conductive feature 130, 132. In an embodiment, and as will be described in more detail in association with FIGS. 2 and 3, a dielectric medium 166 may be disposed within at least a portion of some or all of cavities 160. According to an embodiment, one or more through wafer vias 168 may be used to electrically couple top interconnect structures 134 to back metal 140 or backside contact 142.

FIG. 2 is a cross section view of device 100 along cut line 2-2 showing further details of the device 100. According to an embodiment, device 100, as viewed along cut line 2-2, includes semiconductor substrate 110, transistor 120, first conductive feature or inductor 130, second conductive feature or back metal 140, first conductor-less regions 150, and cavity 160.

Semiconductor substrate 110 may include a top substrate surface 219, and a bottom substrate surface 210, a host substrate 212, a buffer layer 214, a channel layer 216, and a barrier layer 218. In an embodiment, host substrate 212 includes an upper surface 213 and is formed from silicon carbide (SiC). In other embodiments, host substrate 212 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials. Buffer layer 214 is formed on upper surface 213 of host substrate 212. Buffer layer 214 may include one or more group III-N semiconductor layers and is supported by host substrate 212. Buffer layer 214 may be a multi-layer structure, where each of the semiconductor layers of buffer layer 214 may include an epitaxially grown group III nitride epitaxial layer, for example. The group-III nitride epitaxially grown layers that make up buffer layer 214 may include nitrogen (N)-polar (i.e. N-face) or gallium (Ga)-polar (i.e. Ga-face) material, for example. In other embodiments, the semiconductor layer(s) of buffer layer 214 may not be epitaxially grown. In still other embodiments, the semiconductor layer(s) of buffer layer 214 may include Si, GaAs, InP, or other suitable materials.

Buffer layer 214 may include at least one AlGaN mixed crystal layer having a composition denoted by $Al_XGa_{1-X}N$ with an aluminum mole fraction, X, that can take on values between 0 and 1. The total thickness of buffer layer 214 with all of its layers may be between about 200 angstroms and about 100,000 angstroms although other thicknesses may be used. A limiting X value of 0 yields pure GaN while a value of 1 yields pure aluminum nitride (AlN). In an embodiment, buffer layer 214 may include a nucleation region comprised of AlN. The nucleation region starts at the interface between the host substrate 212 and buffer layer 214, and extends about 100 angstroms to about 2000 angstroms into buffer layer 214. Buffer layer 214 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layers may be configured as GaN (X=0) where the $Al_XGa_{1-X}N$ that is not intentionally doped (NID). Alternatively, the additional $Al_XGa_{1-X}N$ layers may be configured as one or more GaN layers where the one or more GaN layers are intentionally doped with dopants that may include iron (Fe), chromium (Cr), carbon (C) or other suitable dopants that render buffer layer 214 substantially insulating or high resistivity. The dopant concentration may be between about $10^{17}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, a combination of these, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, buffer layer 214 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 angstroms and about 2000 angstroms though other thicknesses may be used.

In an embodiment, channel layer 216 is formed over buffer layer 214. Channel layer 216 may include one or more group III-N semiconductor layers and is supported by buffer layer 214. Channel layer 216 may include an $Al_XGa_{1-X}N$ layer where X takes on values between 0 and 1. In an embodiment, channel layer 216 is configured as GaN (X=0) although other values of X may be used without departing from the scope of the inventive subject matter. The thickness of channel layer 216 may be between about 50 angstroms and about 10,000 angstroms, though other thicknesses may be used. Channel layer 216 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 216 may include NID or doped $In_YGa_{1-Y}N$, where Y, the indium mole fraction, may take a value between 0 and 1.

Barrier layer 218 is formed over channel layer 216 in accordance with an embodiment. Barrier layer 218 may include one or more group III-N semiconductor layers and is supported by channel layer 216. Barrier layer 218 may have a larger bandgap and/or larger spontaneous polarization than channel layer 216 and, when barrier layer 218 is over channel layer 216, a channel 217 is created in the form of a two dimensional electron gas (2-DEG) within channel layer 216 adjacent the interface between channel layer 216 and barrier layer 218. In addition, tensile strain between barrier layer 218 and channel layer 216 may cause additional piezoelectric charge to be introduced into the 2-DEG and channel 217. Barrier layer 218 may be a multi-layer structure, where the first layer of barrier layer 218 may include at least one NID $Al_XGa_{1-X}N$ layer where X takes on values between 0 and 1. In some embodiments, X may take a value of 0.1 to 0.35, although other values of X may be used. The thickness of the first layer of barrier layer 218 may be between about 50 angstroms and about 1000 angstroms though other thicknesses may be used. Barrier layer 218 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. There may be an additional AlN interbarrier layer (not shown) formed between channel layer 216 and barrier layer 218, in some embodiments. The AlN interbarrier layer may introduce additional spontaneous and piezoelectric polarization, increasing the channel charge and improving the electron confinement of the resultant 2-DEG. In other embodiments, barrier layer 218 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form barrier layer 218, the thickness of barrier layer 218 may be between about 50 angstroms and about 2000 angstroms though other thicknesses may be used. In the case of using InAlN to form barrier layer 218, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

A cap layer (not shown) may be formed over barrier layer 218. The cap layer presents a stable surface for semiconductor substrate 110 and serves to protect the top substrate surface 219 from chemical and environmental exposure incidental to wafer processing. The cap layer may include one or more group III-N semiconductor layers and is supported by barrier layer 218. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

Without departing from the scope of the inventive subject matter, it should be appreciated that the choice of materials and arrangement of layers to form semiconductor substrate 110 is exemplary. The inclusion of host substrate 212, buffer layer 214, channel layer 216, and barrier layer 218 into semiconductor substrate 110 is exemplary and the function and operation of the various layers may be combined and may change depending on the materials used in any specific embodiment. In other embodiments using N-polar materials (not shown), channel layer 216 may be disposed over barrier layer 218 to create a 2-DEG and channel directly underneath an optional GaN cap and control electrode 126. Still further embodiments may include semiconductor layers formed from materials including GaAs, indium phosphide (InP), aluminum gallium arsenide (AlGaAs), indium gallium phosphide (InGaP), indium gallium arsenide (InGaAs), and aluminum indium arsenide (AlInAs) to form semiconductor substrate 110.

One or more isolation region(s) 112 may be formed within semiconductor substrate 110 to define an active area 114 proximate to top substrate surface 219, according to an embodiment. Isolation region(s) 112 may be formed via an implantation procedure configured to damage the epitaxial and/or other semiconductor layers to create high resistivity semiconductor regions 222 of semiconductor substrate 110, rendering semiconductor substrate 110 high resistivity or semi-insulating in high resistivity semiconductor regions 222 while leaving the crystal structure intact in the active area 114. In other embodiments (not shown), isolation region(s) 112 may be formed by removing one or more of the epitaxial and/or other semiconductor layers of semiconductor substrate 110 in areas corresponding to the isolation region(s) 112, thus removing channel 217 in the isolation region(s) 112, rendering the remaining layers of semiconductor substrate 110 semi-insulating and leaving behind active area 114 "mesas" surrounded by high resistivity or semi-insulating isolation region(s) 112.

As was discussed in conjunction with the description of FIG. 1 in part, transistor 120 is formed over the top surface 218 of semiconductor substrate 110. Transistor 120 may include active region 114 within semiconductor substrate 110, drain electrode 122, source electrode 124 (current-conducting electrodes), gate electrode 126, first dielectric layer 220, second dielectric layer 224, and first interconnect metal 128.

In an embodiment, first dielectric layer 220 may be formed over active area 114 and isolation region 112. According to an embodiment, and as will be described later in conjunction with the method depicted in FIG. 11 describing fabrication step 1100, first dielectric layer 220 may include one or more substantially insulating dielectric layers. In an embodiment, first dielectric layer 220 may include silicon nitride (SiN), silicon dioxide (SiO$_2$), silicon oxynitride (SiON), hafnium oxide (HfO$_2$), or other insulating materials. In other embodiments, first dielectric layer 220 may include thermally conductive materials such as diamond, poly-diamond, AlN, BN, SiC, or other high thermal conductivity substantially insulating or semi insulating materials. In an embodiment, first dielectric layer 220 has thickness values in the range of about 100 angstroms to about 3000 angstroms, though other thickness values may be used, depending on the thermal conductivity of the material used to realize first dielectric layer 220.

In an embodiment, current-conducting electrodes such as source electrode 124 and drain electrode 122 may be formed over and in contact with semiconductor substrate 110 adjacent gate electrode 126 in active area 114. According to an embodiment, source electrode 124 and drain electrode 122 are created in openings made in first dielectric layer 220.

In an embodiment, drain electrode 122 and source electrode 124 (current-conducting electrodes) are created from ohmic contacts to channel 217. As will be described later, in an embodiment of a method for forming drain electrode 122 and source electrode 124, as depicted and described in conjunction with FIGS. 13 and 14 and steps 1300 and 1400 below, low work function materials may be combined with high conductivity materials and refractory barrier materials in a metal stack to form drain electrode 122 and source electrode 124 coupled to channel 217, according to an embodiment. Drain electrode 122 and source electrode 124 may be formed over and in contact with top substrate surface 219, according to an embodiment. In other embodiments, source electrode 124 and drain electrode 122 may be recessed below top substrate surface 219 and extend partially into barrier layer 218. In still other embodiments, ion implantation of Si, Ge, or other appropriate dopants, may be used to form ohmic contact to the channel 217.

Figure 15:
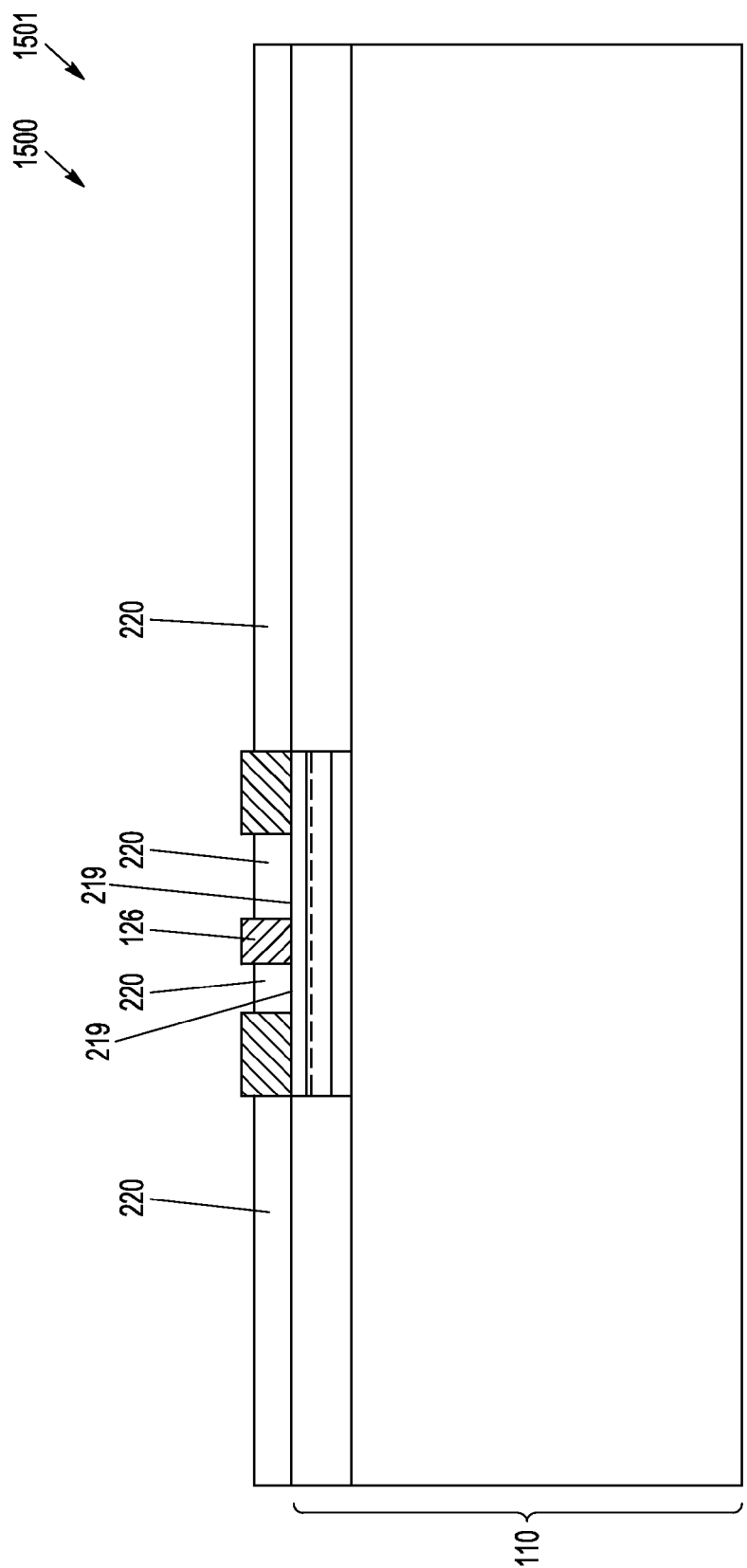

In an embodiment, gate electrode 126 (control electrode) is formed over semiconductor substrate 110 in active region 114. Gate electrode 126 is electrically coupled to the channel 217 through upper surface 219 and barrier layer 218. Changes to the electric potential on gate electrode 126 shift the quasi Fermi level for barrier layer 218 compared to the quasi Fermi level for channel layer 216 and thereby modulate the electron concentration in channel 217 within the portion of semiconductor substrate 110 under gate electrode 126. In an embodiment, gate electrode 126 is configured as a Schottky gate and may be formed over and directly in contact with top substrate surface 219 using a Schottky material layer and a conductive metal layer. A conductive, low stress metal is deposited over the Schottky material layer to form gate electrode 126, in an embodiment. Gate electrode 126 may have a square cross-sectional shape as shown or may have a T-shaped cross section with a vertical stem over semiconductor substrate 110 and a wider portion over the vertical stem in other embodiments. In other embodiments, gate electrode 126 may be recessed through top substrate surface 219 and extend partially into barrier layer 218, increasing the electrical coupling of gate electrode 126 to channel 217 through barrier layer 218. As will be described later, in an embodiment of a method for forming gate electrode 126, as depicted in FIG. 15 and described in conjunction with step 1500 below, Schottky or other suitable materials may be combined with highly conductive materials in a metal stack to form a gate electrode 126 for a low loss gate electrode electrically coupled to channel 217, according to an embodiment. In other embodiments, gate electrode 126 may be formed over a gate dielectric or gate oxide forming a metal-insulator-semiconductor (MIS) junction or metal oxide semiconductor (MOS) junction, electrically coupled to the channel 117 through the gate dielectric or gate oxide layer.

In an embodiment, first interconnect metal 128 may be electrically coupled to transistor 120. In an embodiment, first interconnect metal 128 may be formed over top substrate surface 219 and first dielectric layer 220 and electrically coupled to one or more of drain electrode 122, source electrode 124, and/or gate electrode 126. First interconnect metal 128 may include an adhesion layer and a primary conductive layer in contact with the adhesion layer. The adhesion layer may be selected from one or more of titanium (Ti), titanium tungsten (TiW), Cr, or other suitable low-stress material(s). The adhesion layer may have a thickness between about 50 angstroms and about 1 microns, although other thicknesses may be used. The conductive layer may be selected from one or more of gold (Au), aluminum (Al), silver (Ag), or copper (Cu). The conductive layer may have a thickness of between about 0.1 and about 20 microns though other thicknesses may be used.

In an embodiment, inductor 130 (a first conductive feature) may be electrically coupled to first interconnect metal 128 that is electrically coupled to transistor 120. Metallization used to form inductor 130 may include an adhesion layer disposed over first dielectric 220 and a primary conductive layer disposed over the adhesion layer. The adhesion layer may be selected from one or more of Ti, TiW, Cr, or other suitable low-stress material(s). The adhesion layer may have a thickness between about 50 angstroms and about 1 micron, although other thicknesses may be used. The conductive layer may be selected from one or more of Au, Al, Ag, or Cu. The conductive layer may have a thickness of between about 0.1 and about 20 microns though other thicknesses may be used. It should be appreciated that the configuration and arrangement of inductor 130 (first conductive feature) with respect to first interconnect metal 128 is exemplary and may be re-arranged according to the specific design of device 100. For example, in other embodiments, inductor 130 may be formed under first interconnect metal 128 (i.e., between first interconnect metal 128 and the top substrate surface 219). In still other embodiments, inductor 130 may be formed using the same metallization layer as first interconnect metal 128. Further, although inductor 130 is shown as being formed from a single metal layer, alternate embodiments of inductors may be formed from multiple metal layers (e.g., multiple coils in multiple metal layers) that are interconnected with conductive vias.

In an embodiment, back metal 140 and/or backside contact 142 (a second conductive feature) may include an adhesion layer that contacts bottom substrate surface 210 and a primary conductive layer that contacts the adhesion layer. The adhesion layer may be selected from one or more of Ti, TiW, Cr, or other suitable low-stress material. The adhesion layer may have a thickness between about 50 angstroms and about 2 microns, although other thicknesses may be used. The conductive layer may be selected from one or more of Au, Al, Ag, Cu, a combination of these, or other conductive material. The conductive layer may have a thickness of between about 0.1 and about 50 microns though other thicknesses may be used. In an embodiment, back metal 140 and backside contact 142 are etched to expose bottom substrate surface 210 and form first conductor-less region(s) 150 in the etched regions.

In an embodiment, cavity 160 is formed in semiconductor substrate 110, adjacent (i.e., next to but not underlying) transistor 120. According to an embodiment, cavity 160 is partially defined by an inner cavity surface 262 with inner cavity dimension 263 that defines an upper surface of cavity 160, a cavity wall 264, subtended by lower substrate surface 210 at a cavity wall angle 265, that defines the side wall of cavity 160, and one of conductor-less region(s) 150 with outer cavity dimension 267 that defines the opening of cavity 160 within lower substrate surface 210. Inner cavity dimension 263 may be defined by etching into semiconductor substrate 110 and may be between about 5 microns and about 1000 microns although other suitable dimensions may be used. The cavity wall angle 265 subtended by cavity wall 264 and lower substrate surface 210 may be between about 80 degrees and about 150 degrees in an embodiment. In other embodiments, cavity wall angle 265 may be between about 90 degrees and about 110 degrees, though other angles may be used. Outer cavity dimension 267 may be defined by etching into semiconductor substrate 110 and may be between about 5 microns and about 1000 microns though other suitable dimensions may be used. A cavity height 268 defined by the inner cavity dimension 263, cavity wall angle 265, outer cavity dimension 267, and the thickness of back metal 140 may be between about 1 and about 50 microns though other suitable dimensions may be used. In an embodiment, cavity 160 may extend vertically into host substrate 212 from the bottom substrate surface 210. In some embodiments, cavity 160 may terminate on upper surface 213 of host substrate 212, forming recessed surface 262, defining the vertical dimension of cavity 160. In other embodiments, recessed surface 262 defining the vertical dimension of cavity 160 may terminate within or on one of semiconductor layers 218, 216, 214 over host substrate 212, within semiconductor substrate 110. In still other embodiments, cavity 160 may extend only partially through host substrate 212 to a depth that is below upper surface 213. In still other further embodiments, cavity 160 may extend through top substrate surface 219 and may terminate in first dielectric layer 220 or second dielectric layer 224.

Without departing from the scope of the inventive subject matter, in other embodiments (not shown), cavity 160 may underlie a portion of transistor 120. In these embodiments, at least a portion of drain 122, source 124, and/or gate 126 act as the first conductive region that overlies and is aligned with cavity 160.

In an embodiment, dielectric medium 166 may fill cavity 160. In an embodiment, dielectric medium 166 has a lower dielectric constant than that of host substrate 212. For example, the dielectric constant of the host substrate 212 may be in a range of about 9 to about 14, and the dielectric constant of dielectric medium 166 may be in a range of about 1 to about 8, in an embodiment. In alternate embodiments, the dielectric constants of host substrate 212 and dielectric medium 166 may be lower or higher than the above-given ranges. According to an embodiment, the term "less than," when used to describe a relative relationship between the dielectric constants of host substrate 212 and dielectric medium 166 means that the dielectric constant of the dielectric medium 166 is about 90 percent or less of the dielectric constant of the host substrate 212, or that the dielectric constant of the dielectric medium 166 is about 50 percent or less of the dielectric constant of the host substrate 212.

In an embodiment, dielectric medium 166 is formed using one or more of benzocyclobutene (BCB), polyimide, epoxy, spin-on glass, a combination of these or other suitable dielectric materials. In other embodiments, dielectric 166 is air. In an embodiment, dielectric medium 166 fills cavity 160 and conductor-less region(s) 150 terminating on a dielectric medium surface 167. In other embodiments, dielectric medium 166 partially fills cavity 160 and/or conductor-less region 150. In these embodiments, a void (not shown) may be left between the plane of back metal surface 242 and dielectric medium surface 167 leaving air as the dielectric medium in the unfilled portion of cavity 160 and/or conductor-less region 150.

In an embodiment, through wafer via(s) 168 are formed in semiconductor substrate 110, adjacent transistor 120. In an embodiment, each through wafer via 168 is formed by etching host substrate 212 and overlying semiconductor layers in isolation region 112 to expose first interconnect metal 128 and/or top interconnect structure(s) 134. In other embodiments, through wafer via(s) 168 are formed in semiconductor substrate 110, underneath transistor 120 and vertically aligned to drain electrode 122 or source electrode 124. In these embodiments, each through wafer via 168 is formed by etching host substrate 212 and overlying semiconductor layers in isolation region 112 to expose at least a portion of drain electrode 122, source electrode 122, first interconnect metal 128 and/or top interconnect structure(s) 134. Metal used to form back metal 140 and/or backside contact 142 may be used to fill or coat the sidewalls of the inside of through wafer via 168 and to contact drain electrode 122, source electrode 124, first interconnect metal 128 and/or top interconnect structure(s) 134 to provide electrical coupling between drain electrode 122, source electrode 122, first interconnect metal 128, top interconnect structure(s) 134, back metal 140 and/or backside contact 142.

FIG. 3 is a cross sectional view of device 100 along cut line 3-3 of FIG. 1 showing further aspects of the device 100. More particularly, FIG. 3 shows a view of device 100 with a partial view of transmission line 132, and the conductive connection between top interconnect structure 134 and backside contact 142, according to an embodiment. In an embodiment, transmission line 132 is aligned in the vertical direction with cavity 160. Cavity 160 is filled with dielectric medium 166 according to an embodiment. In an embodiment, the connection of first interconnect metal 128 and top interconnect structure 134 to backside contact 142 may be accomplished using through wafer via 168 to electrically couple backside contact 142 to first interconnect metal 128 and top interconnect structure 134 using the metal layer that forms both back metal 140 and backside contact 142. Conductor-less regions 150 electrically isolate backside contact 142 from back metal 140, according to an embodiment. In an embodiment, dielectric medium 166 may fill conductor-less regions 150 within cavity 160 and in conductor-less regions 150 that isolate back metal 140 from backside contact 142.

Figure 4:
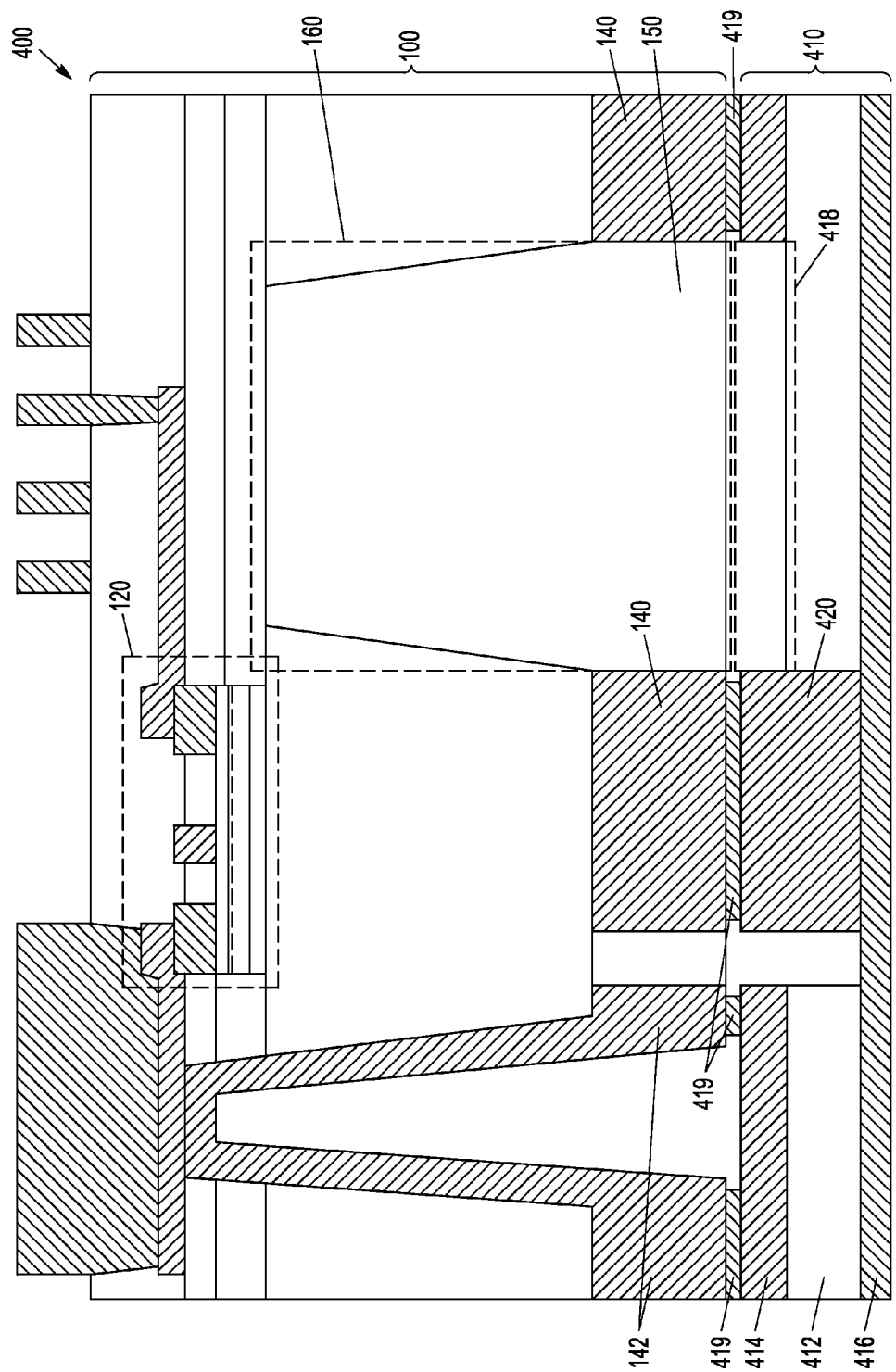
FIG. 4 is a cross sectional view of an electronic assembly in accordance with an embodiment.

FIG. 4 is a cross sectional view of electronic assembly 400 showing other aspects of the inventive subject matter according to an embodiment. In an embodiment, electronic assembly 400 may include device 100 of FIGS. 1-3, one or more printed circuit board(s) (PCB's) 410 and a flange 420. In an embodiment, device 100 is coupled to PCB 410.

In an embodiment, PCB 410 may include one or more PCB dielectric region(s) 412, one or more PCB top conductor(s) 414, and one or more PCB bottom conductor(s) 416. In an embodiment, PCB dielectric 412 may include, but is not limited to a polytetrafluoroethylene (PTFE) (random glass or ceramic) composite laminate, ceramic, alumina, beryllium oxide (BEO), a combination of these and/or other suitable dielectric substrates. In an embodiment, PCB top conductor 414 may be patterned to accommodate backside contact 142 of device 100. For example, PCB top conductor 414 may be patterned to form a PCB conductor-less region 418 that aligns in the vertical direction with conductor-less region 150 under cavity 160 that is vertically aligned with inductor 132. PCB top conductor 414 may be bonded to backside contact 142 and/or back metal 140 using an appropriate solder or other bonding material 419. PCB(s) 410 may be mounted to a suitable package or module (not shown).

In an embodiment, flange 420 may be bonded to back metal 140 of device 100 in using solder or other bonding material 419. In an embodiment, flange 420 is mounted to back metal 140 vertically below transistor 120 to provide a thermal heat path that allows heat to flow from transistor 120 through host substrate 212 to an appropriate heat sink or other thermal reservoir coupled to flange 420 (not shown).

It should be appreciated that, because inductor 130 is backed by an underlying cavity 160 filled with dielectric medium 166, as shown in FIGS. 1-4, inductor 130 has a higher quality factor (Q), lower capacitance, and a higher self resonance frequency than conventional inductors that lack such an underlying cavity. Likewise, characteristic impedances for transmission line 132 backed by cavity 160 containing dielectric 166 is higher than conventional transmission lines that lack an underlying cavity.

The Q of inductor 130 and/or transmission line 132 increases because dielectric medium 166 may include an insulating material (e.g. BCB) that has extremely high resistivity (e.g. $10^5$-$10^{10}$ ohm-cm) compared to Si (e.g. 10-5000 ohm-cm). Therefore, dielectric losses and eddy current losses associated with inductor 130 and/or transmission line 132 decrease and the Q of inductor 130 and/or transmission line 132 increases.

The capacitance between inductor 130 of FIGS. 1-3 and a voltage reference plane or ground plane below cavity 160 reduces because of the lower dielectric constant of dielectric medium 166 compared to host substrate 212. The voltage reference plane or ground plane may be provided by a package or flange that device 100 is mounted to (e.g., flange 420), or by a conductor of PCB 410 (e.g., PCB top conductor 414 or PCB bottom conductor 416), when used in an electronic assembly such as in FIG. 4 or other circuitry (not shown). In addition, the lower capacitance of inductor 130 increases its self-resonance frequency. The higher self-resonance frequency increases the potential operating frequency of inductor 132 compared to conventional inductors without cavity 160. Likewise, the lower capacitance of transmission line 132 also raises its characteristic impedance. The characteristic impedance of transmission line 132 can be approximated by the square root of the ratio of inductance per unit length divided by capacitance per unit length. Lowering the capacitance per unit length of transmission line 132 using the lower dielectric constant of dielectric medium 166 within cavity 160 raises the characteristic impedance of transmission line 132.

Figure 5:
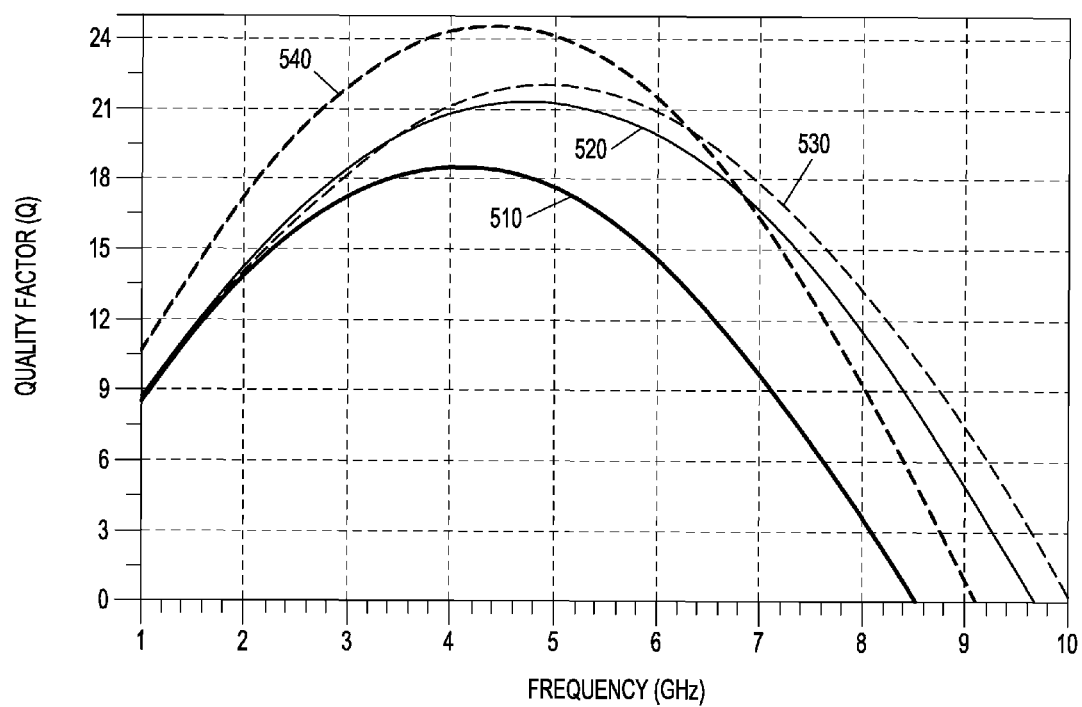
FIG. 5 is a chart of quality factor (Q) versus frequency associated with an inductor of the device of FIGS. 1-4 in various embodiments, as compared to that of a conventional inductor.
Figure 6:
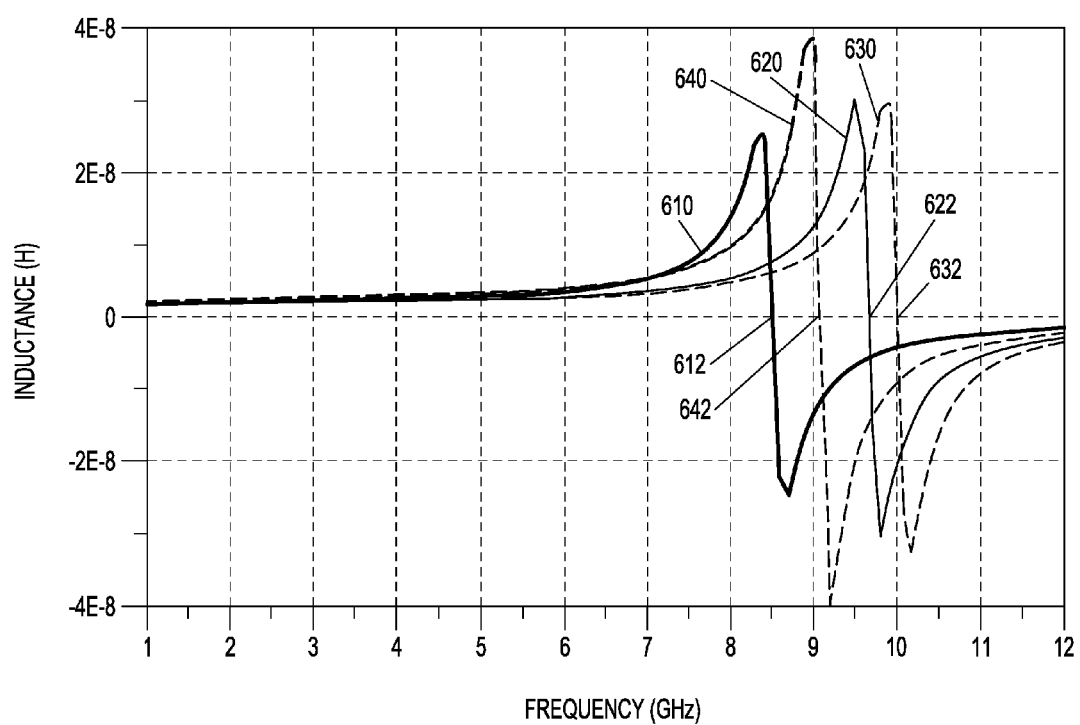
FIG. 6 is a chart of inductance versus frequency associated with an inductor of the device of FIGS. 1-4 in various embodiments, as compared to that of a conventional inductor.

To illustrate higher Q and lower capacitance, FIGS. 5 and 6 depict simulated characteristics of inductor 132 of device 100 compared to a conventional inductor. For these charts, it is assumed that host substrate is 800 ohm-cm Si and that the host substrate is about 100 microns thick. In addition to conventional inductors, the case of FIG. 4 with PCB 420 is also compared and shown by 540, 640, 740, and 840. For 420, the PCB dielectric constant is 3.48, thickness of PCB dielectric is about 500 microns, and the loss tangent or dissipation factor, tan δ, is 0.0037.

FIG. 5 is a chart of quality factor (Q) versus frequency associated with inductor 130 of device 100 of FIGS. 1-4 which is backed by cavity 160 in various embodiments, as compared to that of a conventional inductor backed by the host substrate 212 (e.g., an inductor backed by 4 mil thick, 800 ohm-cm high resistivity Si) instead of cavity 160. Trace 510 depicts the Q over frequency of a conventional spiral inductor backed by Si and a voltage reference plane located directly below the inductor at the bottom substrate surface (e.g. mounted to a flange), and shows that a peak Q of approximately 18 is achieved at about 4 gigahertz (GHz). In contrast, trace 520 shows that, when a cavity (e.g., cavity 160) backs a spiral inductor (e.g., spiral inductor 130) and BCB is used as a dielectric medium (e.g., dielectric medium 166) within the cavity, and with a voltage reference plane at the lower back metal surface (e.g., surface 242), a peak Q of approximately 21 is achieved at about 5 GHz. Trace 530 shows a slightly higher Q, in excess of 21, when the dielectric medium is changed to air under those same conditions. The Q increases in the devices corresponding to traces 520 and 530, as compared with the conventional device corresponding to trace 510, because both BCB and air have lower losses than a Si substrate, and also because the lower dielectric constants of BCB or air within a cavity underlying the inductor (e.g., cavity 160) puts the voltage reference plane at a greater electrical distance from the inductor. Trace 540 shows that the peak Q of an inductor (e.g., inductor 130) increases to 24 at about 4.4 GHz when a PCB material with 20 mil thickness underlies a cavity filled with BCB as a dielectric medium, as in the electronic assembly 400 described in connection with FIG. 4. In such an embodiment, the voltage reference plane is moved even further away from the inductor to the PCB bottom conductor, thus further increasing the electrical distance between the inductor and the voltage reference plane.

FIG. 6 is a chart of inductance versus frequency associated with an inductor with an underlying cavity filled with a dielectric medium or air (e.g., inductor 130 of device 100 of FIGS. 1-4) in various embodiments, as compared to that of a conventional inductor without such an underlying cavity. Trace 610 shows inductance versus frequency for the same conventional spiral inductor described in connection with FIG. 5 above. This trace shows that the conventional inductor has a self resonance point 612 at approximately 8.5 GHz. Trace 620 shows inductance versus frequency for an inductor (e.g., inductor 130) of a device that includes an underlying cavity filled with BCB as a dielectric medium. In such an embodiment, the self resonance point 622 is at approximately 9.5 GHz. Trace 630 shows inductance versus frequency for an inductor of a device with an underlying cavity that includes air as a dielectric medium inside of the cavity. In such an embodiment, the self resonance point 632 is at approximately 10 GHz. Trace 640 shows that the inductance versus frequency when a PCB material with 20 mil thickness instead of metal backs a cavity filled with BCB as a dielectric medium, as in the electronic assembly 400 described in connection with FIG. 4. In such an embodiment, the self resonance 642 occurs at approximately 9 GHz.

Figure 7:
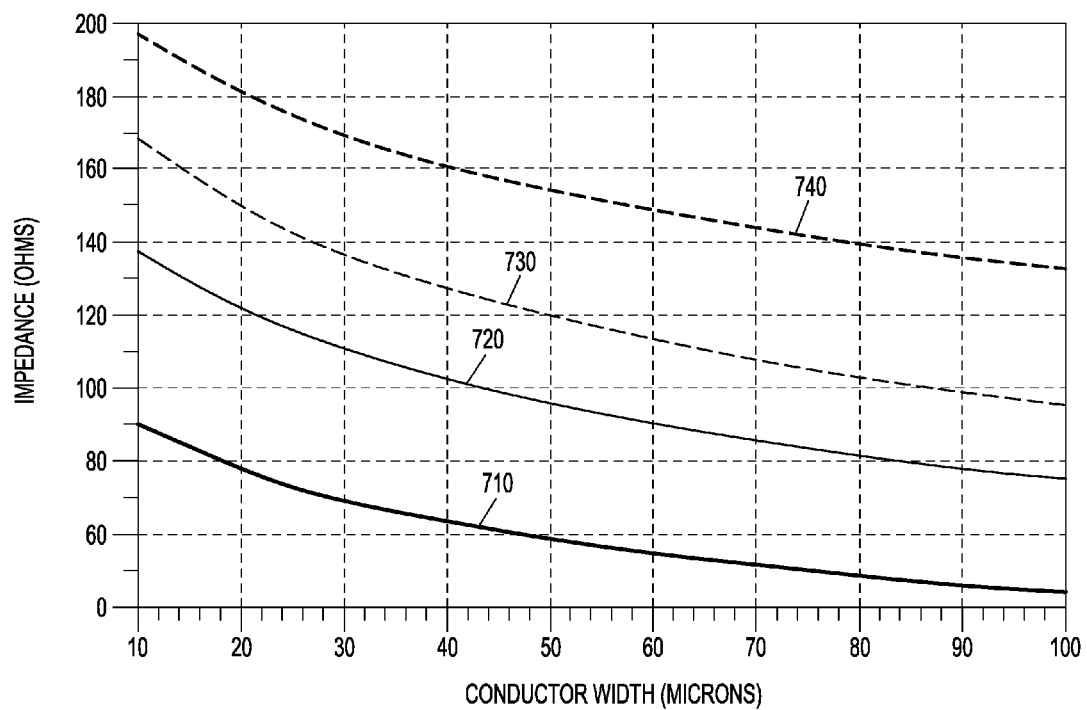
FIG. 7 is a chart of impedance versus conductor width associated with a transmission line of the device of FIGS. 1-4 in various embodiments, as compared to that of a conventional transmission line.
Figure 8:
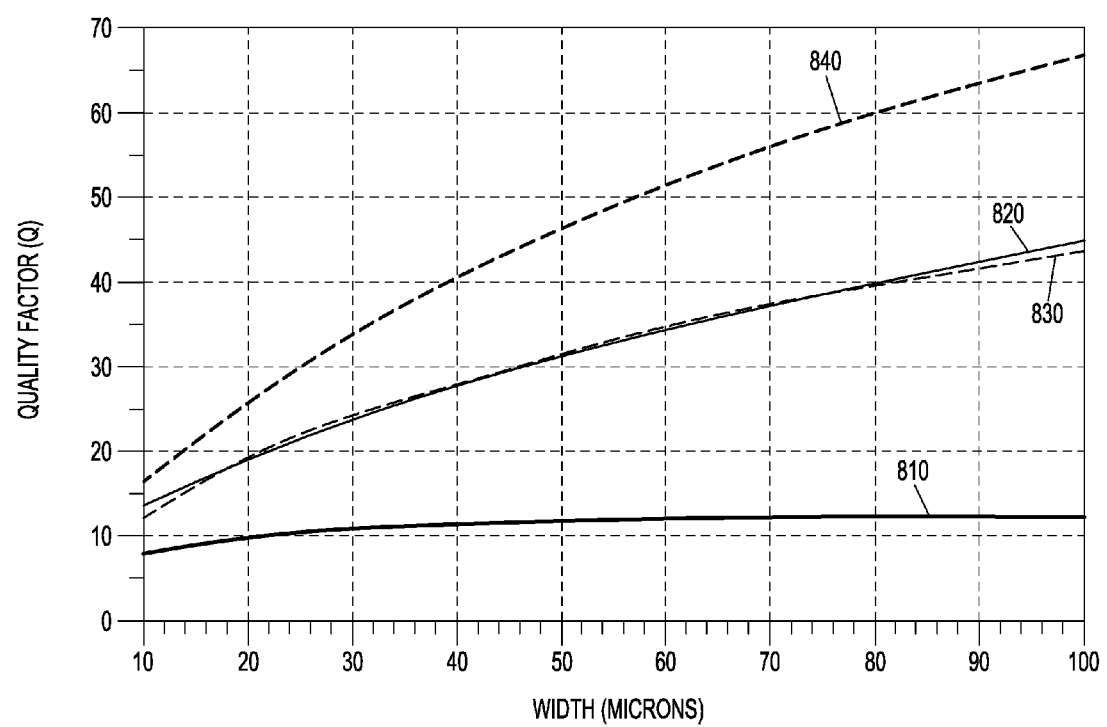
FIG. 8 is a chart of Q versus conductor width for a transmission line of the device of FIGS. 1-4 in various embodiments, as compared to that of a conventional transmission line.

FIG. 7 and FIG. 8 show the effect of backing transmission line 132 of FIGS. 1-4 with cavity 160. FIG. 7 is a chart of impedance versus conductor width associated with a transmission line (e.g., transmission line 132 of device 100 of FIGS. 1-4), in various embodiments as compared to that of a conventional transmission line. Herein a conventional transmission line refers to a transmission line backed by the same material used to realize the host substrate. Trace 710, which corresponds to a conventional transmission line, shows that the impedance of such a conventional transmission line is approximately 90 ohms for a 10 micron conductor width and as low as approximately 45 ohms for a 100 micron conductor width. In contrast, trace 720, which represents the impedance versus conductor width for a transmission line (e.g., transmission line 132) that is backed by a cavity filled with BCB as a dielectric medium, indicates that such a transmission line has an impedance of approximately 140 ohms for a 10 micron conductor width and approximately 76 ohms for a 100 micron conductor width. Likewise, trace 730, which represents the impedance versus conductor width for a transmission line (e.g., transmission line 132), that is backed by a cavity filled with air, has an impedance of approximately 170 ohms for a 10 micron conductor width and an impedance of approximately 97 ohms for a conductor width of 100 microns. In each of these foregoing cases, the voltage reference plane for the transmission line is assumed to be at a lower back metal surface (e.g., surface 242). In contrast, trace 740 represents the impedance versus conductor width for a transmission line (e.g., transmission line 132) when a PCB material with 20 mil thickness instead of metal backs a cavity filled with BCB as a dielectric medium, as in the electronic assembly 400 described in connection with FIG. 4. Trace 740 shows that the impedance of the transmission line is approximately 198 ohms for a 10 micron wide conductor and that the impedance is approximately 135 ohms for a 100 micron wide conductor. Thus in each of the embodiments associated with traces 720, 730, and 740, the transmission line impedance ranges from more than 50 percent to more than 100 percent higher than a conventional transmission line without a cavity and backed by a host substrate.

FIG. 8 is a chart of Q versus conductor width for a transmission line (e.g., transmission line 132 of device 100 of FIGS. 1-4) in various embodiments as compared to that of a conventional transmission line. Trace 810 shows that the Q of a conventional transmission line is approximately 8 for a 10 micron conductor width and approximately 13 for a 100 micron conductor width. In contrast, trace 820, which represents the Q for a transmission line that is backed by a cavity filled with BCB as a dielectric medium, shows that the transmission line has a Q of approximately 14 for a 10 micron conductor width and approximately 44 for a 100 micron conductor width. Likewise, trace 730, representing Q versus conductor width for a transmission line backed by a cavity filled with air, shows that the transmission line has a Q of approximately 12 for a 10 micron conductor width and a Q of approximately 43 for a conductor width of 100 microns. In each of these foregoing cases, the voltage reference plane for the transmission line is assumed to be a conductor in the plane of the lower back metal surface (e.g., surface 242). Trace 840 represents Q versus conductor width for a transmission line (e.g., transmission line 132) when a PCB material with 20 mil thickness instead of metal backs a cavity filled with BCB as a dielectric medium, as in the electronic assembly 400 described in connection with FIG. 4. Trace 740 shows that the Q of the transmission line is approximately 16 for a 10 micron wide conductor and that the Q is approximately 67 for a 100 micron wide conductor. Thus in each of the embodiments associated with traces 820, 830, and 840, the transmission line Q ranges from more than 100 percent to more than 500 percent higher than a conventional transmission line without a cavity and backed by a host substrate.

Figure 9:
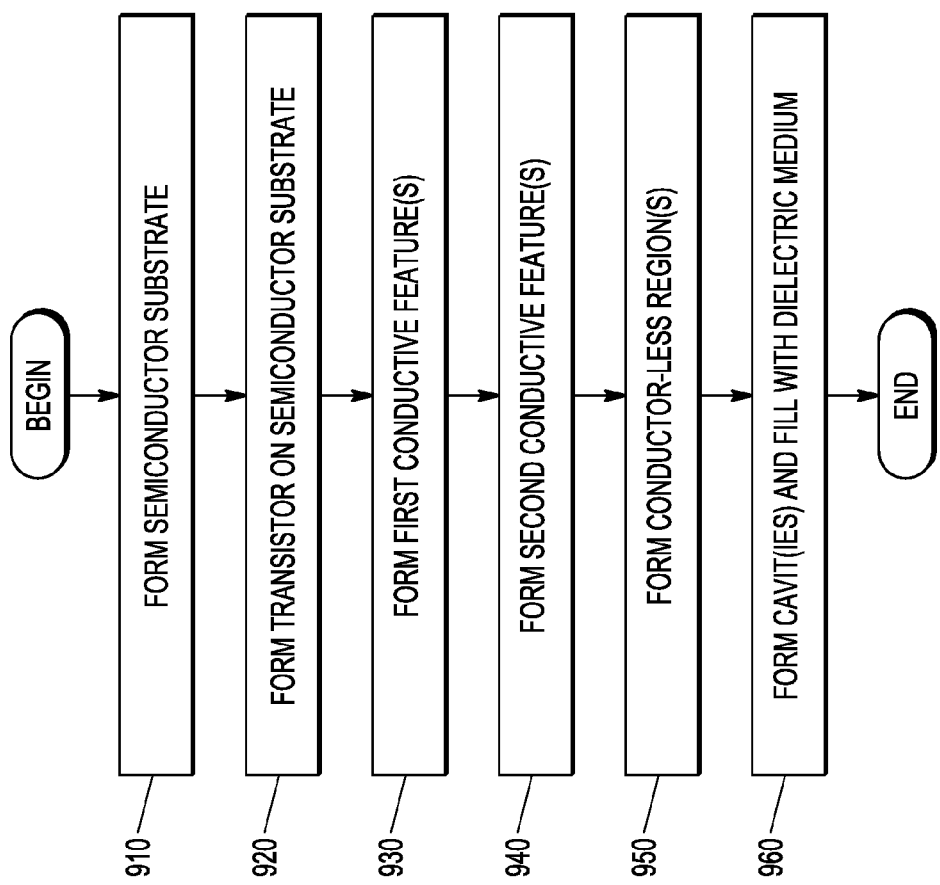
FIG. 9 is a flowchart of a method of fabricating the device of FIG. 1, according to an embodiment.

FIG. 9 is a simplified flowchart depicting a method of fabricating a device (e.g., device 100), according to an embodiment. In block 910, a semiconductor substrate (e.g., substrate 110) is formed as will be described in detail in connection with FIG. 10 and step 1000. In block 920, a transistor (e.g., transistor 120) is formed as will be described in FIGS. 11-17 and steps 1100-1700. In block 930, one or more first conductive features (e.g., inductor 130 and or transmission line 132) are formed as will be described in FIG. 18 and step 1800. In block 940, one or more second conductive features (e.g., back metal 140 and backside contact(s) 142) are formed as will be described in FIG. 19 and step 1900. In block 950, one or more conductor-less regions (e.g., regions 150) are formed as will be described in FIG. 20 and step 2000. In block 960, one or more cavities (e.g., cavities 160) are formed and filled with dielectric medium (e.g., dielectric medium 166) as will be described in FIGS. 21-23 and steps 2100-2300.

Figure 10:
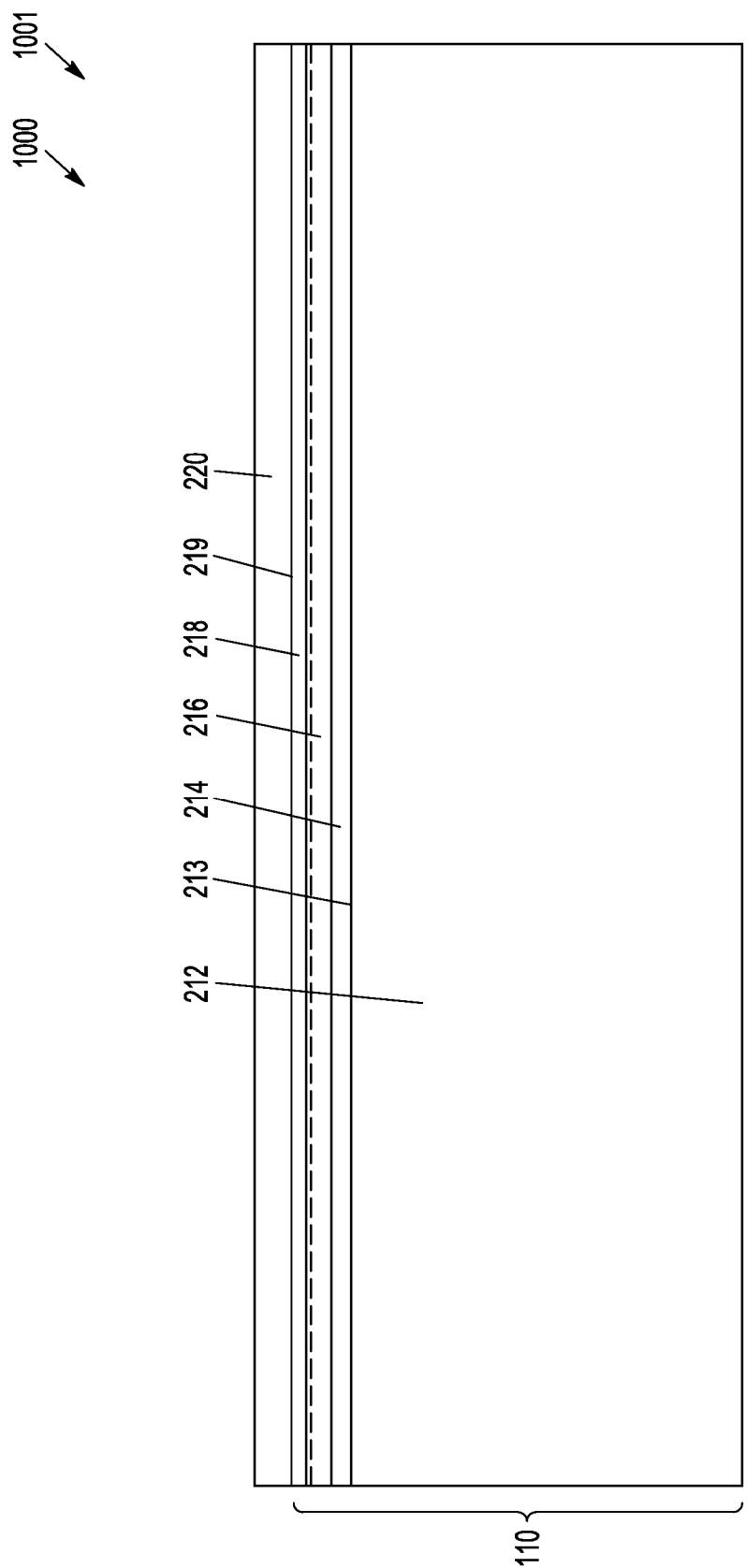
FIGS. 10-24 display simplified cross sectional views of a series of fabrication steps for forming the device of FIG. 1, according to an embodiment.

FIGS. 10-24 display simplified cross sectional views of a series of fabrication steps 1000-2400 for forming device 100 of FIG. 1, according to an embodiment. Referring first to FIG. 10, a step 1000 of the method includes forming a semiconductor substrate 110 and then depositing first dielectric layer 220 over top substrate surface 219, according to an embodiment. In an embodiment, forming semiconductor substrate 110 includes providing host substrate 212 and depositing buffer layer 214, channel layer 216, barrier layer 218, and a cap layer (not shown) over and on top of host substrate 212 to form semiconductor substrate 110. The host substrate 212 may include Si, sapphire, SiC, GaN, AlN, diamond, poly-SiC, Si on insulator, GaAs, InP, or other suitable materials. According to an embodiment, buffer layer 214 may be deposited on or over an upper surface 213 of host substrate 212. Buffer layer 214 may include one of GaN, AlGaN, InGaN, a combination of these, or other suitable materials. According to an embodiment, channel layer 216 may be deposited on or over an upper surface of buffer layer 214. Channel layer 216 may include one of GaN, AlGaN, InGaN, a combination of these, or other suitable materials. According to an embodiment, barrier layer 218 may be deposited on or over channel layer 216. Barrier layer 218 may include one of AlGaN, InAlN, a combination of these or other suitable materials. According to an embodiment, a cap layer (not shown) may be deposited on or over the barrier layer 218. The cap layer may include GaN or other suitable materials. Each of buffer layer 214, channel layer 216, barrier layer 218, and the cap layer may be grown over an upper surface 213 of host substrate 212 using one of metal-organo chemical vapor deposition (MOCVD), molecular beam epitaxy (MBE), hydride-vapor phase epitaxy (HVPE) or a combination of these techniques, though other suitable techniques may be used.

According to an embodiment, the method further includes depositing a first dielectric layer 220 over top substrate surface 219. In an embodiment, first dielectric layer 220 may include one or more layers of silicon nitride, $SiO_2$, $HfO_2$, $Al_2O_3$, diamond, poly-diamond, AlN, BN, SiC a combination of these or other insulating materials. The total thickness of the layer(s) used to form first dielectric layer 220 may be between about 100 angstroms and about 10,000 angstroms in thickness, although other thickness values may be used. In an embodiment, first dielectric layer 220 may be formed by depositing $Al_2O_3$ over and in contact with semiconductor substrate 110 and then depositing SiN over the $Al_2O_3$ layer. In another embodiment, first dielectric layer 220 may be formed by depositing $Al_2O_3$ or SiN or a combination of these over and in contact with semiconductor substrate 110 and then depositing diamond, AlN, or another suitable substantially insulating material over the $Al_2O_3$ layer. First dielectric layer 220 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s). Structure 1001 results.

Figure 11:
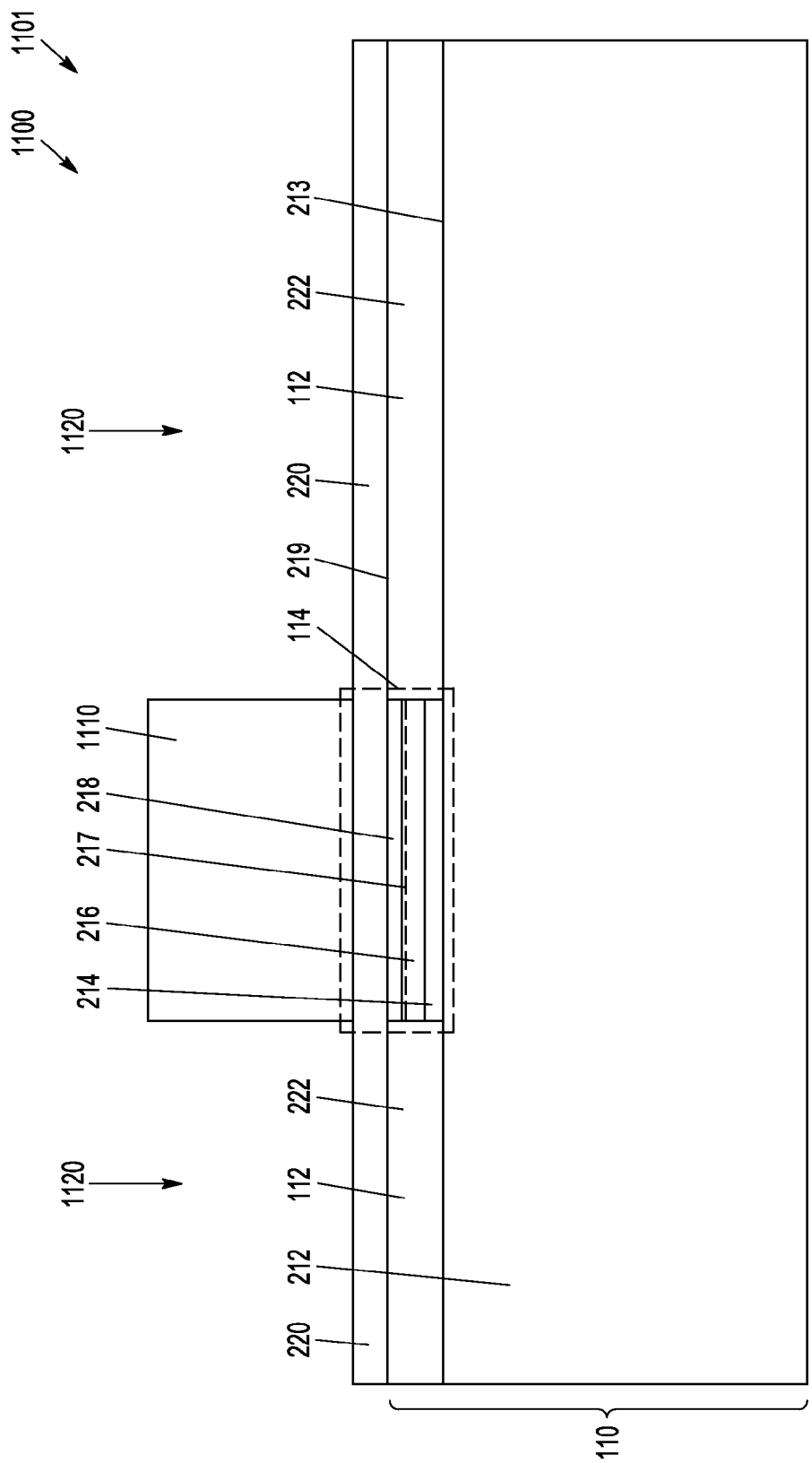

Referring now to FIG. 11 and step 1100, the method of fabricating device 100 further includes dispensing photo-resist layer 1110 over structure 1001 of FIG. 10, patterning resist layer 1110, and then implanting an ion species into first dielectric layer 220 and into semiconductor substrate 110 through openings 1120 created in resist layer 1110 to create isolation regions 112, which define active area 114. According to an embodiment, photo-resist layer 1110 may include one or more layers of photo-resist with a thickness that ranges from about 0.2 microns to about 10 microns, although electron beam resist or other suitable patterning materials of other thicknesses also may be used. Patterning resist layer 1110 may include applying a mask over photo-resist layer 1110, exposing unmasked portions of photo-resist layer 1110 to an appropriate dose of photon or electron beam irradiation, and then developing photo-resist layer 1110 with an appropriate developer.

According to an embodiment, isolation regions 112 may be formed by implanting an ion species at an energy sufficient to drive the species through dielectric layer 220 and into barrier layer 218, channel layer 216, and buffer layer 214, thus damaging the crystal lattice for these layers, disrupting channel 217 within the isolation regions 112, and creating high resistivity semiconductor regions 222 within semiconductor substrate 110. According to an embodiment, one of N, boron (B), helium (He), hydrogen (H), or a combination of these or one or a combination of other suitable ion species may be implanted through openings 1120 in photo-resist layer 1110 to create high resistivity semiconductor regions 222 below upper surface 219 of semiconductor substrate 110. The depth of high resistivity semiconductor regions 222 depends on the thicknesses of first dielectric layer 220, barrier layer 218, channel layer 216, and buffer layer 214 as well as the accelerating potential and mass of the ion species implanted into semiconductor substrate 110. Both the presence of the implanted species as well as the damage caused within the crystal lattice within semiconductor substrate 110 render the affected high resistivity regions 222 semi-insulating, thus forming isolation regions 112. Structure 1101 results. The remaining areas protected by resist layer 1110 that are not exposed to ion implantation, etching, or otherwise rendered high resistivity or removed are included in the active area 114. After formation of isolation region 112, resist layer 1110 is removed from structure 1101 using appropriate solvents (not shown).

In other embodiments (not shown), isolation regions 112 are formed by removing (e.g., etching) dielectric layer 220, barrier layer 218, channel layer 216, and buffer layer 214 within the isolation regions 112 to remove channel 217 within the isolation regions 112. In these embodiments using etched isolation, the etching of semiconductor layers that overlie host substrate 212 including barrier layer 218, channel layer 216, and buffer layer 214 may terminate within one of these layers. Alternatively, the etching may terminate on upper surface 213 of host substrate 212 or may extend into host substrate 212 below upper surface 213. In some embodiments, etching may be used in conjunction with ion implantation to create isolation regions 112. In further embodiments, the upper etched surface that results from isolation via etching may serve as inner cavity surface 262 referred to in FIG. 2.

Figure 12:
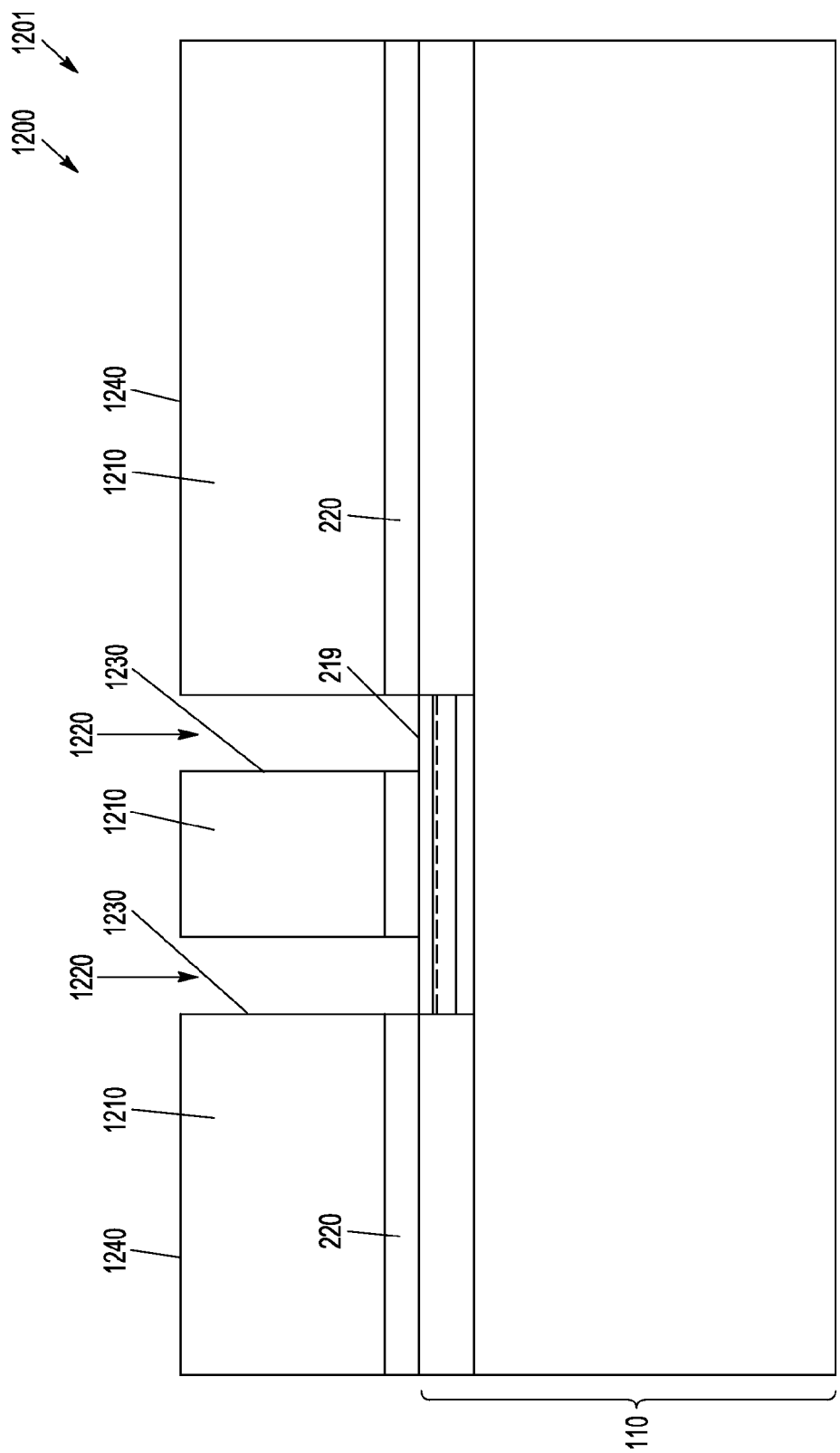
Figure 13:
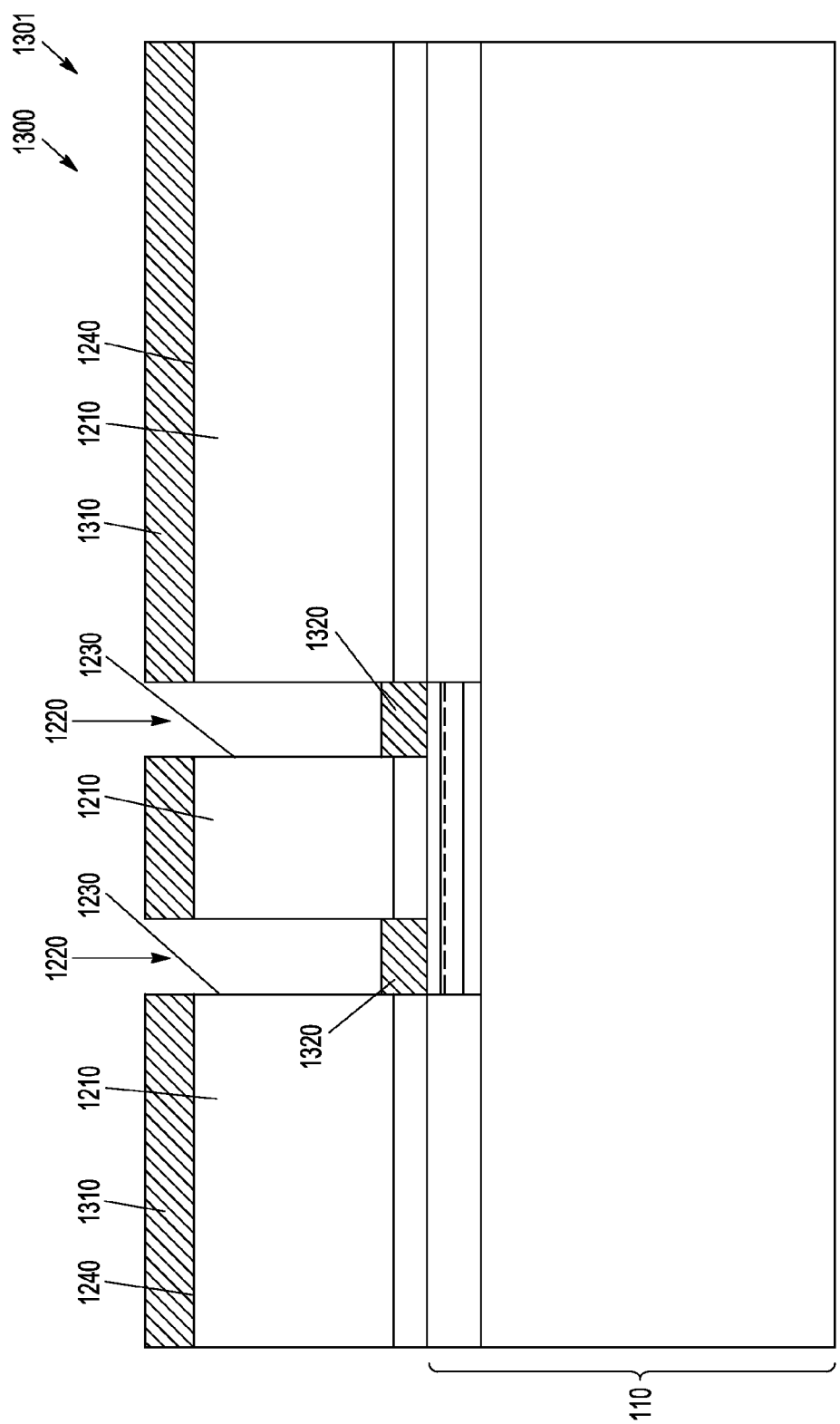
Figure 14:
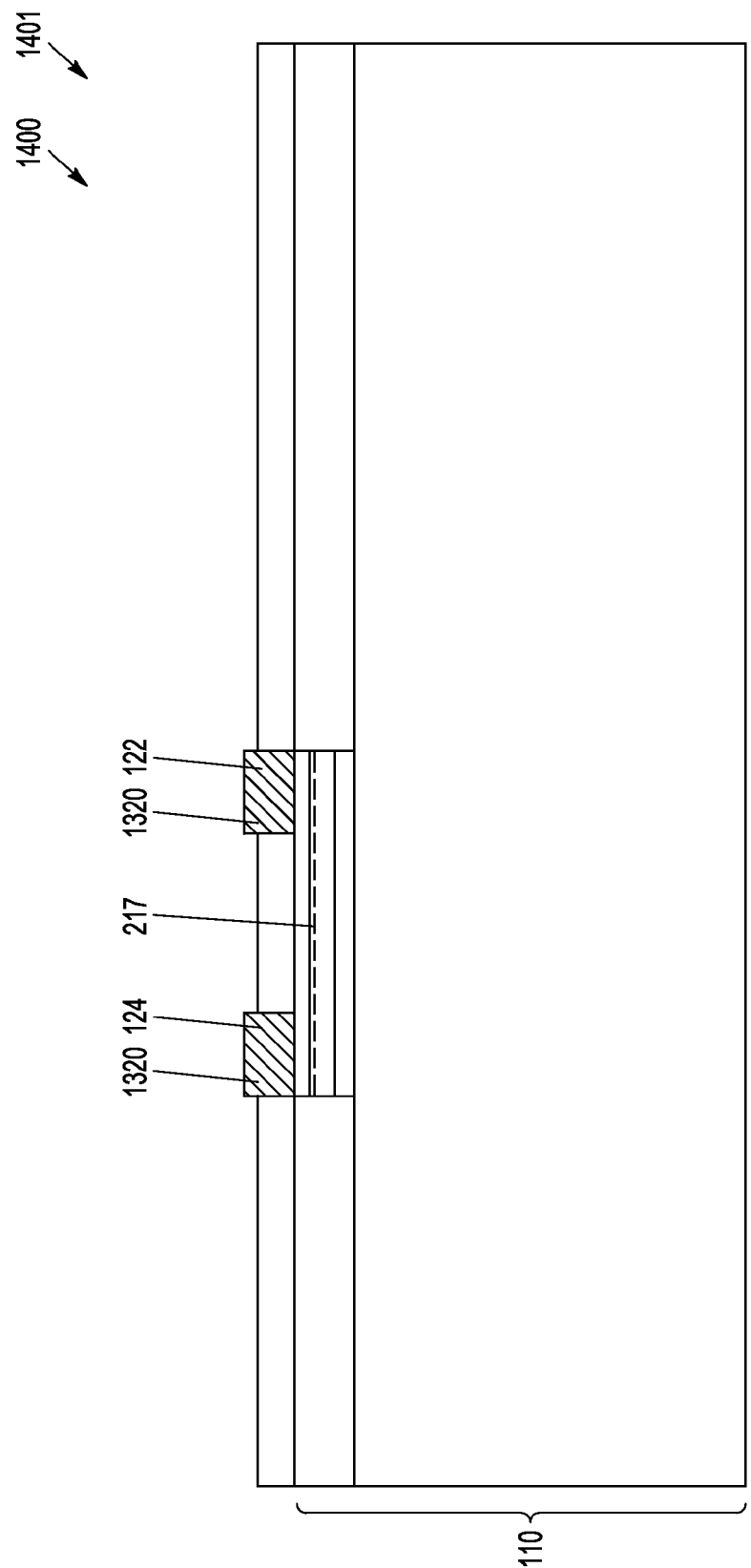

Referring now to FIGS. 12-14 and steps 1200-1400, the method of fabricating device 100 further includes forming drain electrode 122 and source electrode 124 of FIG. 2. FIG. 12 and step 1200 depicts and describes creating openings 1220 for forming source electrode 124 and drain electrode 122 of FIGS. 1-3 according to an embodiment. In an embodiment, openings 1220 in resist layer 1210 are created by dispensing resist layer 1210 over structure 1101 of FIG. 11, and patterning resist layer 1210. According to an embodiment, resist layer 1210 may include one or more layers of photo-resist with a thickness that ranges from about 0.5 microns to about 10 microns, although electron beam resist or other suitable patterning materials or of other thicknesses may be used. Patterning resist layer 1210 to create openings 1220 may include applying a mask over resist layer 1210, exposing unmasked portions of resist layer 1210 with an appropriate dose or doses of photon and/or electron beam irradiation and then developing the resist layer 1210 with an appropriate developer. In an embodiment, the openings 1220 may be aligned to isolation regions 112 using alignment marks or other appropriate means created using a separate alignment mark level (not shown) also aligned to isolation regions 112. In other embodiments, step 1200 may be a first step in the method, requiring no alignment to a prior process layer. In an embodiment, a "lift-off profile" is used to create a profile for the sidewalls 1230 within the openings 1220 such that the openings 1220 are slightly larger at the bottom of the openings 1220 near the upper surface 219 of semiconductor substrate 110 than at the resist upper surface 1240. The lift-off profile ensures that subsequent deposition of metal will not create metal connection bridges between metal deposited over the upper surface 1240 of resist layer 1210 and within openings 1220 over and in contact with semiconductor substrate 110. A plasma de-scum process may be used to remove residual traces of undeveloped resist material (not shown) from the exposed upper surface of the first dielectric layer 220 within openings 1220.

In an embodiment, an etch process is used to remove portions of dielectric layer 220 (within openings 1220) thus exposing top substrate surface 219 within openings 1220. In an embodiment, the first dielectric layer 220 is removed using an appropriate dry or wet etch technique or a combination of both. In an embodiment, dry etching of first dielectric layer 220 to expose a portion of the top substrate surface 219 may include reactive ion etching (RIE), inductively coupled plasma (ICP) etching, electron-cyclotron resonance (ECR) etching or a combination of these techniques, though other suitable techniques may be used. Suitable fluorine (F)-based dry etch chemistries such as sulphur hexafluoride ($SF_6$), carbon hexafluoride ($C_2F_6$), carbon tetrafluoride ($CF_4$), or other suitable dry etch chemistries may be used. The dry etch chemistries may be supplemented with argon (Ar) or oxygen ($O_2$) or a combination of these or other suitable gases to prevent polymer formation within the openings 1220 when etching the first dielectric layer 220. Wet etching of the first dielectric layer 220 may be accomplished using hydrofluoric acid (HF), dilute HF, buffered oxide etch (BOE), hot phosphoric acid ($H_3PO_4$), or other suitable wet chemistry technique. In an embodiment, when first dielectric layer 220 includes a SiN layer deposited over an $Al_2O_3$ layer, first dielectric layer 220 may be etched using an F-based dry etch such as RIE, ICP, or ECR to remove the SiN layer followed by a BOE wet etch to remove the $Al_2O_3$ layer, exposing portions of top substrate surface 219 underlying openings 1220. In other embodiments, when a CVD diamond layer or other insulating thermal conductor is deposited directly over and in contact with semiconductor substrate 110, or alternatively, over a lower thermal conductivity insulating layer such as one of $Al_2O_3$, SiN, or a combination of these or other suitable layer(s), an $O_2$ plasma may be used to etch the CVD diamond layer. Suitable wet-etch or dry etch chemistries may be used to remove the underlying (e.g. $Al_2O_3$ or SiN) layer(s). Structure 1201 results.

FIG. 13 depicts depositing an ohmic metal layer 1310 to form contacts 1320, in step 1300 according to an embodiment. In an embodiment, ohmic metal layer 1310 is deposited over and in contact with upper surface 1240 of resist layer 1210 and into the openings 1220 of structure 1201 of FIG. 12 in contact with the exposed portions of the upper surface 219 of the semiconductor substrate 110. In an embodiment, ohmic metal layer 1310 may include a multi-layer stack of metals, including metal layers, from bottom to top, of titanium (Ti), Al, molybdenum (Mo), and Au, although other suitable materials may be used. In an embodiment, the thickness of the Ti layer may range from about 50 to about 500 angstroms, the thicknesses of the Al layer may range from about 500 to about 5000 angstroms, the thicknesses of the Mo layer may range from about 500 to about 1000 angstroms, and the thickness of the Au layer may range from about 500 to about 1000 angstroms, although other ranges of thicknesses may be used for each layer. In some embodiments, one or more of the Ti, Al, Mo, or Au layers may be omitted or substituted for other suitable materials. In an embodiment, the multi-layer stack of metals may be deposited by evaporation, sputtering, PVD, ALD, or other suitable deposition techniques. In an embodiment, the excess regions of ohmic metal layer 1310 not within the openings 1220 may be removed using a "lift-off" technique by immersing the wafer in solvents that penetrate resist layer 1210 through sidewalls 1230 (and/or other sidewalls, not shown) in the resist layer 1210. This causes the ohmic metal layer 1310 that was in contact with the upper surface 1340 of resist layer 1310 but not directly in contact with semiconductor substrate 110 to wash away. Contacts 1320 (or the portions of ohmic metal layer 1310 that are directly in contact with semiconductor substrate 110) remain on the upper surface of the semiconductor substrate 110. In other embodiments, other techniques known in the art such as etching may be used to pattern contacts 1320. Structure 1301 results.

As depicted in FIG. 14 and step 1400, the method further includes annealing contacts 1320 of structure 1301 of FIG. 13 to form drain electrode 122 and source electrode 124, according to an embodiment. In an embodiment, annealing contacts 1320 includes loading structure 1301 of FIG. 13 (after removal of resist layer 1210) into a rapid thermal annealing (RTA) system or thermal furnace and raising the temperature of the semiconductor substrate 110 and contacts 1320 to an appropriate temperature in the presence of a suitable ambient gas or mixture. In an embodiment, an RTA system may be used to anneal contacts 1320 to form drain electrode 122 and source electrode 124 at a temperature between about 500 and about 900 degrees Celsius (° C.) for 15 to 120 seconds, though other suitable temperatures and times may be used. In an embodiment, the RTA system may use one of nitrogen ($N_2$), oxygen ($O_2$), or forming gas ambient, though a combination of these or other suitable ambient gasses may be used. In an embodiment, the time, temperature, and ambient gasses are optimized to create an ohmic contact between drain electrode 122 and channel 217, and between source electrode 124 and channel 217. The ohmic contact resistance between source electrode 124 or drain electrode 122 and channel 217 may between about 0.05 and about 1.00 ohm-mm though other contact resistance values may be used. Structure 1401 results.

Referring now to FIG. 15 and step 1500, the method of fabricating device 100 further includes forming gate electrode 126 according to an embodiment. In an embodiment, forming gate electrode 126 includes applying and patterning resist layer(s) to structure 1401 of FIG. 14, and etching first dielectric layer 220 analogous to steps described in FIG. 12 and step 1200. The embodiment further includes depositing gate metal and lifting-off gate metal analogous to the steps described in FIG. 13 and step 1300.

In an embodiment, photo resist or e-beam resist is patterned to create an opening in the resist in a manner analogous to the description given for FIG. 12 and step 1200. Using the opening created in the resist layer, first dielectric layer 220 may be etched to form a gate contact opening, thus exposing a portion of the top substrate surface 219, according to an embodiment. In an embodiment, one or more layers of gate metal may then be deposited over the opening in the resist to form gate electrode 126 over a top substrate surface 219. Depositing gate metal to form gate electrode 126 may include depositing a multi-layer stack that includes one or more metal layers and/or other suitable materials. A first layer within the multi-stack used to form gate electrode 126 may include titanium (Ti), nickel (Ni), platinum (Pt), copper (Cu), palladium (Pd), chromium (Cr), tungsten (W), iridium (Ir), nickel silicide ($Ni_xSi_y$), polysilicon or other suitable materials. The first layer may be between about 30 and about 2,000 angstroms in thickness, although other thickness values may be used. One or more layers that act as conductive layers may be deposited over the first layer to form gate electrode 126, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir, $Ni_xSi_y$ or other substantially refractive materials that act as a barrier between the portion of the first layer that contacts semiconductor substrate 110 and the conductive layer(s). The barrier metal layer(s) may be between about 50 and about 10,000 angstroms in thickness, although other thickness values may be used. In an embodiment, the various layers used to form gate electrode 126 may be deposited by evaporation, sputtering, PVD, ALD, or other suitable deposition technique(s).

In an embodiment, annealing may be used to stabilize gate electrode 126 analogous to annealing of the source electrode 124 and drain electrode 122 of structure 1401 of FIG. 14 and step 1400. Annealing gate electrode 126 includes placing the semiconductor substrate 110 with gate electrode 126 into a RTA or thermal furnace, raising the temperature of semiconductor substrate 110 and gate electrode 126 to an appropriate temperature in the presence of a suitable ambient gas or mixture. In an embodiment, an RTA system may be used to anneal gate electrode 126 at a temperature between about 200° C. and about 600° C. for 15 seconds to about 2 hours, although other suitable temperatures and times may be used. In an embodiment, the RTA system may use one of $N_2$, $O_2$, air, or forming gas ambient, though a combination of these or other suitable ambient(s) may be used. In an embodiment, the time, temperature, and ambient gasses are optimized to stabilize the gate electrode 126. Structure 1501 results.

It should be appreciated that other methods may be used to form gate electrode 126 without departing from the scope of the inventive subject matter. In methods for fabricating these other embodiments (not shown), gate electrode 126 may be formed by patterning a first resist layer to form an opening, etching first dielectric 220 to create an opening exposing top substrate surface 219, and then removing the first resist layer. In this embodiment, forming gate electrode 126 then includes patterning an opening in a second resist layer aligned over the opening created in first dielectric layer 220 to expose top substrate surface 219. The opening in the second resist layer may be smaller or larger than the opening in first dielectric layer 220. In other embodiments, gate metal may be disposed over a gate dielectric such as $SiO_2$, $HfO_2$, $Al_2O_3$, or similar materials. The gate dielectric may be deposited over and above top substrate surface 219, according to an embodiment. In still other embodiments, gate electrode 126 may be formed using gate metal that is deposited over semiconductor substrate 110 and is then defined by patterning photo resist, and then etching the gate metal. In whichever embodiment or method is selected to form gate electrode 126, gate metal may then be deposited using the methods described in connection with the formation of gate electrode 126 shown in FIG. 15.

Figure 16:
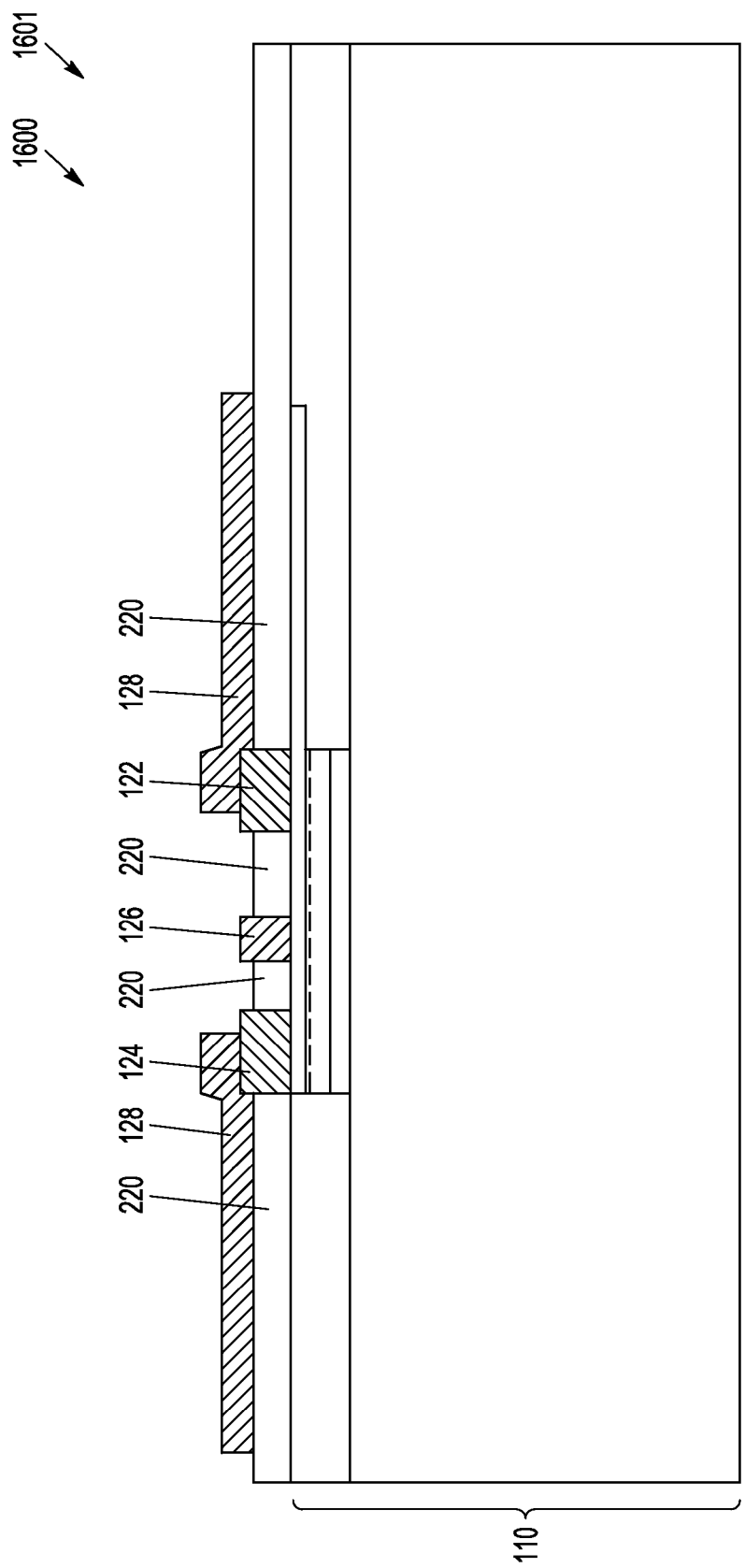

Referring now to FIG. 16 and step 1600, the method of fabricating device 100 further includes depositing and patterning first interconnect metal 128 over drain electrode 122, source electrode 124, and first dielectric 220 of structure 1501 of FIG. 15 according to an embodiment. In an embodiment, patterning first interconnect metal 128 may be accomplished by applying and patterning resist layers (not shown) analogous to step 1000 of FIG. 10 (after removal of resist 1100), depositing first interconnect metal 128, and removing the resist layers and overlying first interconnect metal 128 in a lift-off configuration, analogous to step 1200 in FIG. 12. In an embodiment, first interconnect metal 128 may be formed by metal layers and deposition techniques analogous to the descriptions of step 1300 in FIG. 13 for forming contacts 1320. In an embodiment, first interconnect metal 128 is formed by depositing one or more adhesion and conductive metal layers into openings (not shown) patterned into the resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers used to form first interconnect metal 128 may be deposited over and in contact with drain electrode 122 and source electrode 124, or gate electrode 126, according to an embodiment. In an embodiment, first interconnect metal 128 may also be deposited to electrically contact inductor 130, transmission line 132, and/or other of first conductive features. In an embodiment, the adhesion layer(s) and conductive layer(s) may be formed by sputtering, evaporation, or electro-plating.

In an embodiment, after applying and patterning resist layers and depositing the first interconnect metal 128, the resist layers and metals deposited over the resist layers and not included with the portions of first interconnect metal 128 that contact electrodes 122, 124, 126, and substrate 110 are removed using solvents analogous to those described in conjunction step 1300 in FIG. 13. In other embodiments, first interconnect metal 128 may be formed by depositing adhesion and conductive layers that are then patterned by suitable dry or wet chemical etching techniques. Structure 1601 results.

Figure 17:
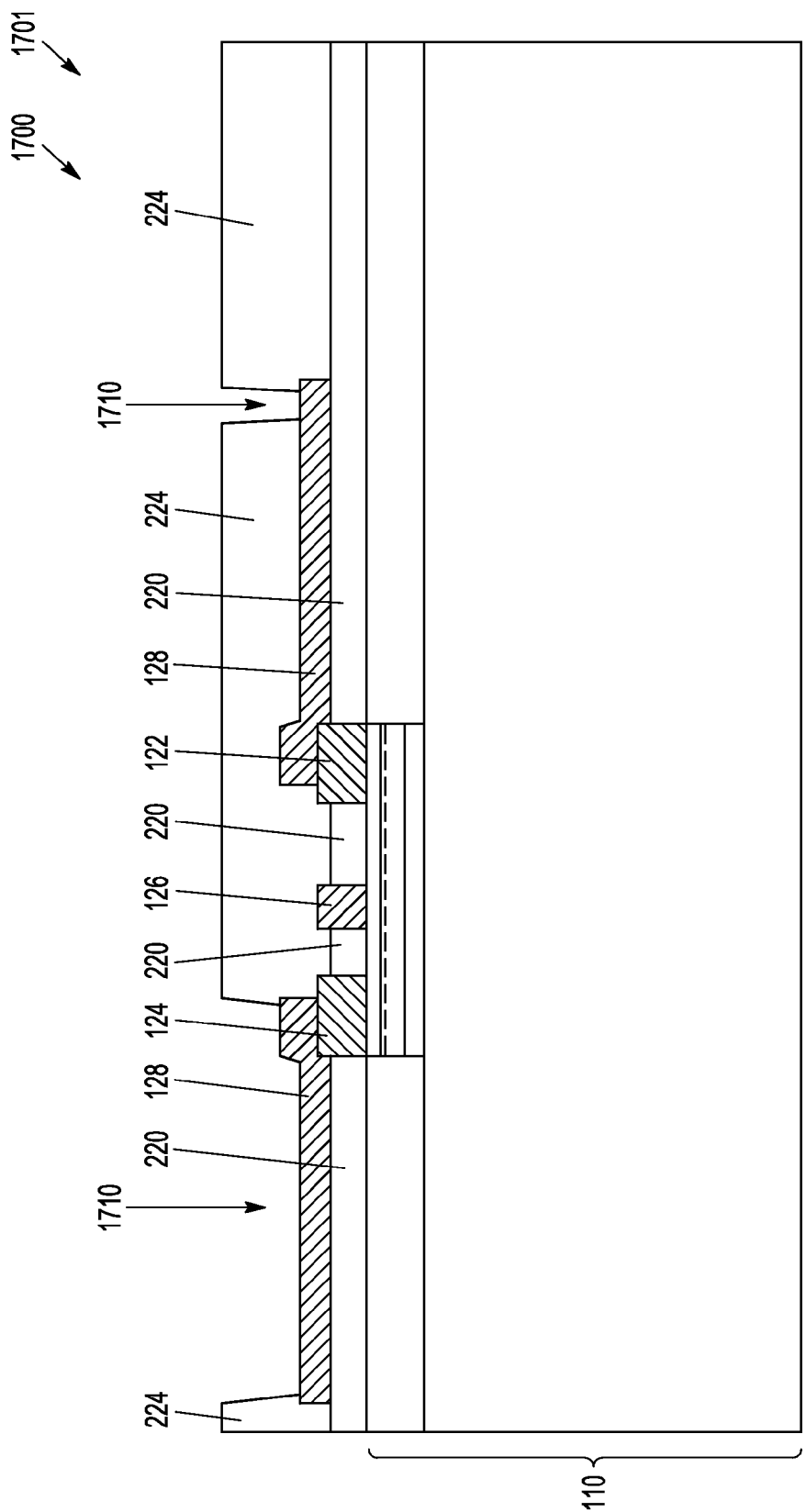

As depicted in FIG. 17 and step 1701 the method for fabricating Device 100 includes depositing second dielectric layer 224 over semiconductor substrate 110, drain electrode 122, source electrode 124, gate electrode 126, first interconnect metal 128, and first dielectric layer 220 of structure 1601 of FIG. 16 according to an embodiment. In an embodiment, second dielectric layer 224 may include one of silicon nitride, $SiO_2$, $HfO_2$, diamond, poly-diamond, AlN, BN, SiC, or a combination of these or other insulating materials. The total thickness of the layers used to form second dielectric layer 224 may be between about 100 and about 10,000 angstroms in thickness, although other thickness values may be used. Second dielectric layer 224 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s). Without departing from the scope of the inventive subject matter, additional process steps (not shown) may be employed to deposit additional metal layers for additional connections between gate electrode 126, first interconnect metal 128 and other circuitry that may be electrically coupled to device 100.

In an embodiment, additional process steps analogous to FIG. 12, step 1200 may be used to create second dielectric openings 1710. In an embodiment, second dielectric layer 224 may be patterned by placing a resist layer (not shown) over second dielectric layer 224, and patterning the resist layer to form openings to portions of the second dielectric layer 224 over the first interconnect metal electrodes 128 that are in contact with drain electrode 122 and source electrode 124 (e.g., using a technique analogous to the patterning of the resist layer 1210 to form openings 1220 depicted in FIG. 12 and step 1200). Second dielectric layer 224 may then be etched through the openings using a technique analogous to the etching of first dielectric 124 as depicted in FIG. 12 and step 1200. Structure 1701 results.

Figure 18:
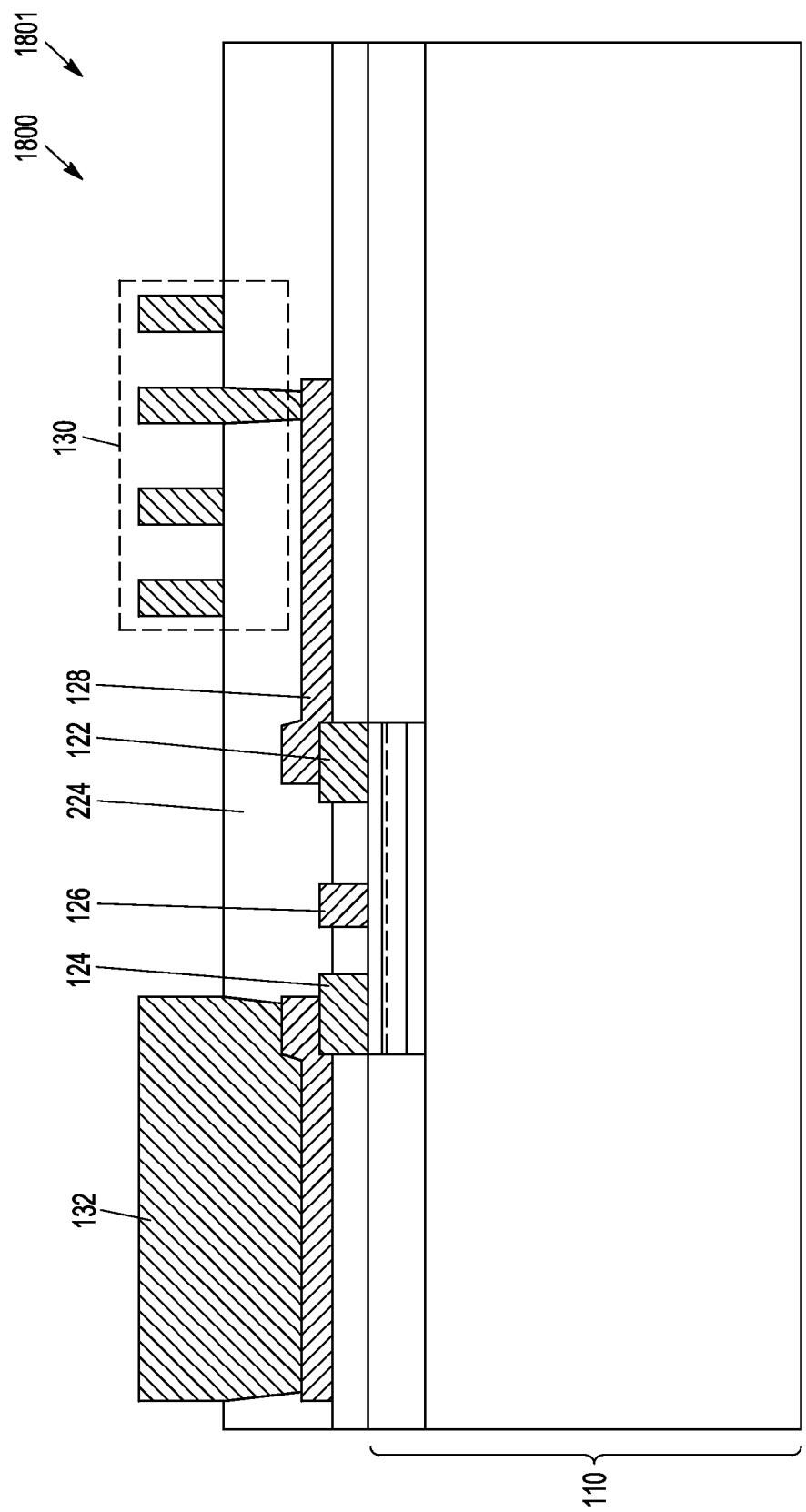

As depicted in FIG. 18, step 1800 includes forming one or more first conductive feature(s) that may include inductor 130, transmission line 132, and top interconnect structure 134 over first interconnect metal 128, of structure 1701 of FIG. 17, according to an embodiment. More specifically, in an embodiment, at least some first conductive features may be formed to directly contact the portions of first interconnect metal 128 that are coupled to drain electrode 122, source electrode 124, and gate electrode 126. In other embodiments (not shown) one or more conductive features may be formed over a portion of the second dielectric layer 224 to provide a top electrode of a metal-insulator-metal (MIM) capacitor.

In an embodiment, first conductive features such as inductor 130, transmission line 132, and top interconnect structure 134 may be formed over first dielectric 220 and/or second dielectric layer 224 by depositing an adhesion layer of Ti, Ni, or Cr and then a second conductive layer of Cu, Au, Al, although other suitable materials may be used. The adhesion layer may be between about 100 and about 2,000 angstroms in thickness, although other thickness values may be used. The conductive layer may include Cu, Au, Al, or Ag, although other suitable materials may be used. The conductive layer may be between about 1000 and about 100,000 angstroms in thickness, although other thickness values may be used. First conductive features such as inductor 130, transmission line 132, and top interconnect structure 134 may be formed by sputtering, evaporation, electro-plating, or other suitable technique. In an embodiment, forming first conductive features 130, 132, and 134 may be accomplished by electro-plating, although other techniques such as lift-off may be used. In other embodiments, first conductive features 130, 132, and 134 may be deposited using a blanket film that is then patterned by suitable dry or wet chemical etching techniques known in the art. Structure 1801 results.

In some embodiments, additional process steps for depositing and patterning one or more additional dielectric layers for moisture and chemical protection may also be employed. The additional dielectric layer(s) may include one of silicon nitride ($Si_3N_4$), silicon dioxide ($SiO_2$), aluminum oxide ($Al_2O_3$), a combination of these or other suitable insulating dielectric layer(s). The additional dielectric layer(s) may have a total thickness of between about 100 and about 20,000 angstroms, although other thickness values may be used. The additional dielectric layer(s) may be formed using PECVD, ALD, ICP, ECR, Cat-CVD, HWCVD, sputtering, or other suitable deposition techniques.

Figure 19:
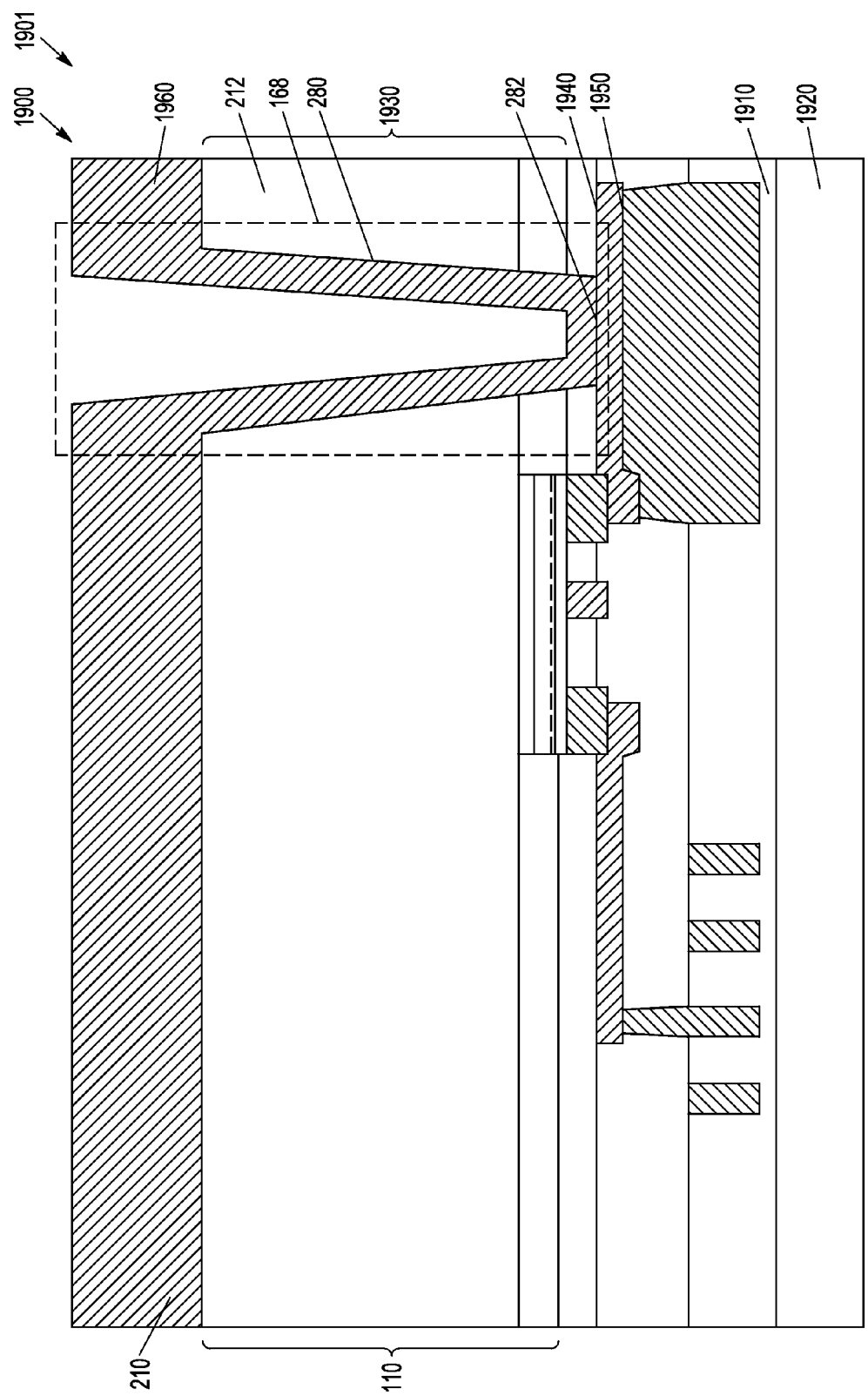

Referring now to FIG. 19 and step 1900, the method of fabricating device 100, includes forming through wafer via 168 within semiconductor substrate 110. In an embodiment, structure 1801 of FIG. 18 is flipped over and mounted by adhesive layer 1910 to carrier substrate 1920. In an embodiment, semiconductor substrate 110 is then thinned to a final substrate thickness 1930 exposing bottom substrate surface 210 using conventional grinding, lapping, and/or polishing techniques. In an embodiment, final substrate thickness 1930 of semiconductor substrate 110 may be between about 10 and about 500 microns though other thicknesses may be used. A suitable masking material (not shown) is then applied to bottom substrate surface 210, according to an embodiment. The masking material may include Al, Ni, Cr, photo-resist, indium tin oxide (ITO) or other suitable materials. In an embodiment, one or more openings (not shown) are created in the masking material.

In an embodiment, the masking material is removed after etching an opening for through wafer via 168 in semiconductor substrate 110. In an embodiment, back-metal layer 1960 is deposited over bottom substrate surface 210 using a first adhesion layer that contacts lower surface 210 and through wafer via sidewalls 280 and recessed surface 282 of through wafer via 168, and a second conductive layer that overlies the first adhesion layer. In an embodiment, the adhesion layer may be selected from Ti, Ni, Cr, Ti—W, Au, Cu, Al, a combination of these, or other materials that adhere to semiconductor substrate 110. In an embodiment, the adhesion layer may be deposited over bottom substrate surface 210 using one or more of sputtering, evaporation, electro-plating or other suitable technique(s). In an embodiment, the conductive layer may be selected from one of Au, Pd, Cu, Al, tin (Sn), Au—Sn eutectic, a combination of these, or other materials that adhere to the adhesion layer and have sufficient electrical conductivity, thermal conductivity, and solder wetting properties. In an embodiment, the conductive layer may be deposited using one or more of sputtering, evaporation, electro-plating, electro-less plating, or other suitable technique(s). In some embodiments, a barrier layer may be inserted between the adhesion layer and the conductive layer to prevent solder applied to back metal layer 1960 to consume the adhesion layer. The barrier layer may include one of vanadium (V), Ti, Ni, or other suitable materials. The barrier layer may be deposited by sputtering, evaporation, plating, or other suitable technique(s).

In an embodiment, through wafer via 168 is created by etching semiconductor substrate 110 using a plasma etch technique. When etching is complete, through wafer via 168 extends from bottom substrate surface 210 and terminates on a first interconnect metal bottom surface 1940. In other embodiments (not shown), through wafer via 168 may terminate on top interconnect structure bottom surface 1950. In an embodiment, plasma etching techniques may be used to create through wafer via 168 in semiconductor substrate 110. These techniques may include reactive ion etching (RIE), inductively coupled plasma (ICP) etching, electron-cyclotron resonance (ECR) etching, or a combination of these techniques, though other suitable techniques may be used. The chemistries selected for the plasma etching techniques depend largely on the materials that comprise host substrate 212 and the semiconductor layers that may overlie host substrate 212. In an embodiment, host substrate 212 includes Si and F-based etch chemistries such as $SF_6$, $C_2F_6$, $CF_4$, combinations of these, or other suitable chemistries may be used to etch host substrate 212. For embodiments that include GaN in high resistivity semiconductor layer 222, Cl-based etch chemistries such as Cl, $BCl_3$, combinations of these, or other suitable chemistries may be used. For both F-based and Cl-based etching, $O_2$ or Ar, or other suitable gases may be added to prevent polymer formation during etching. Structure 1901 results.

Figure 20:
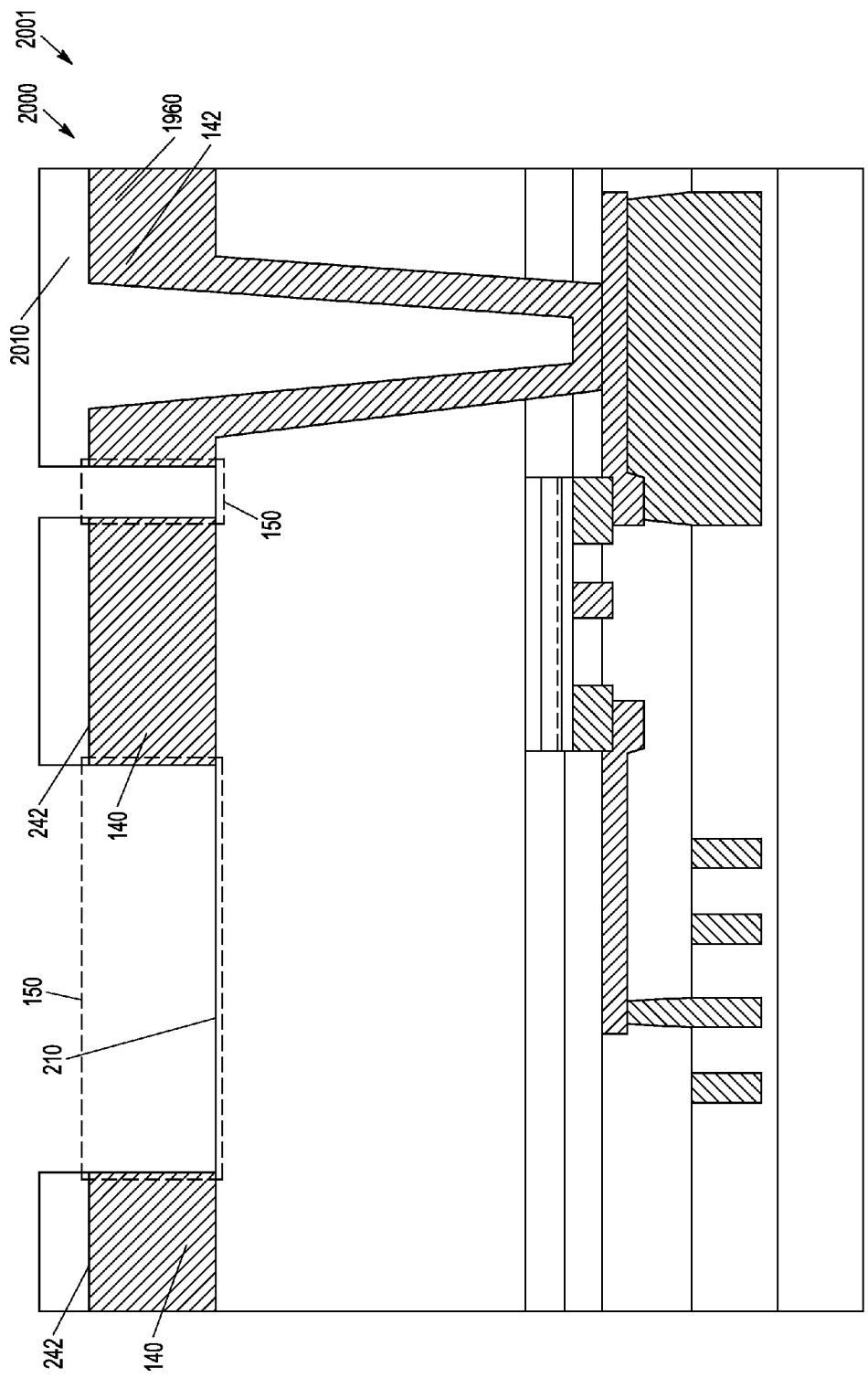

Referring now to FIG. 20 and step 2000, the method of fabricating device 100, includes patterning back metal layer 1960 to form back metal 140 and backside contact 142 (second conductive features) over bottom substrate surface 210 of structure 1901 of FIG. 19. According to an embodiment, a backside masking layer 2010 is disposed over the surface 242 of back metal layer 1960. Backside masking material 2010 is patterned using appropriate photo lithography and/or etching techniques that are familiar to one with skill in the art. Openings 150 are then etched into back metal layer 1960 through openings in the masking layer 2010, thus forming back metal 140 and backside contact(s) 142. Substrate bottom surface 210 is exposed through the openings 150 in back metal layer 1960. Structure 2001 results.

Figure 21:
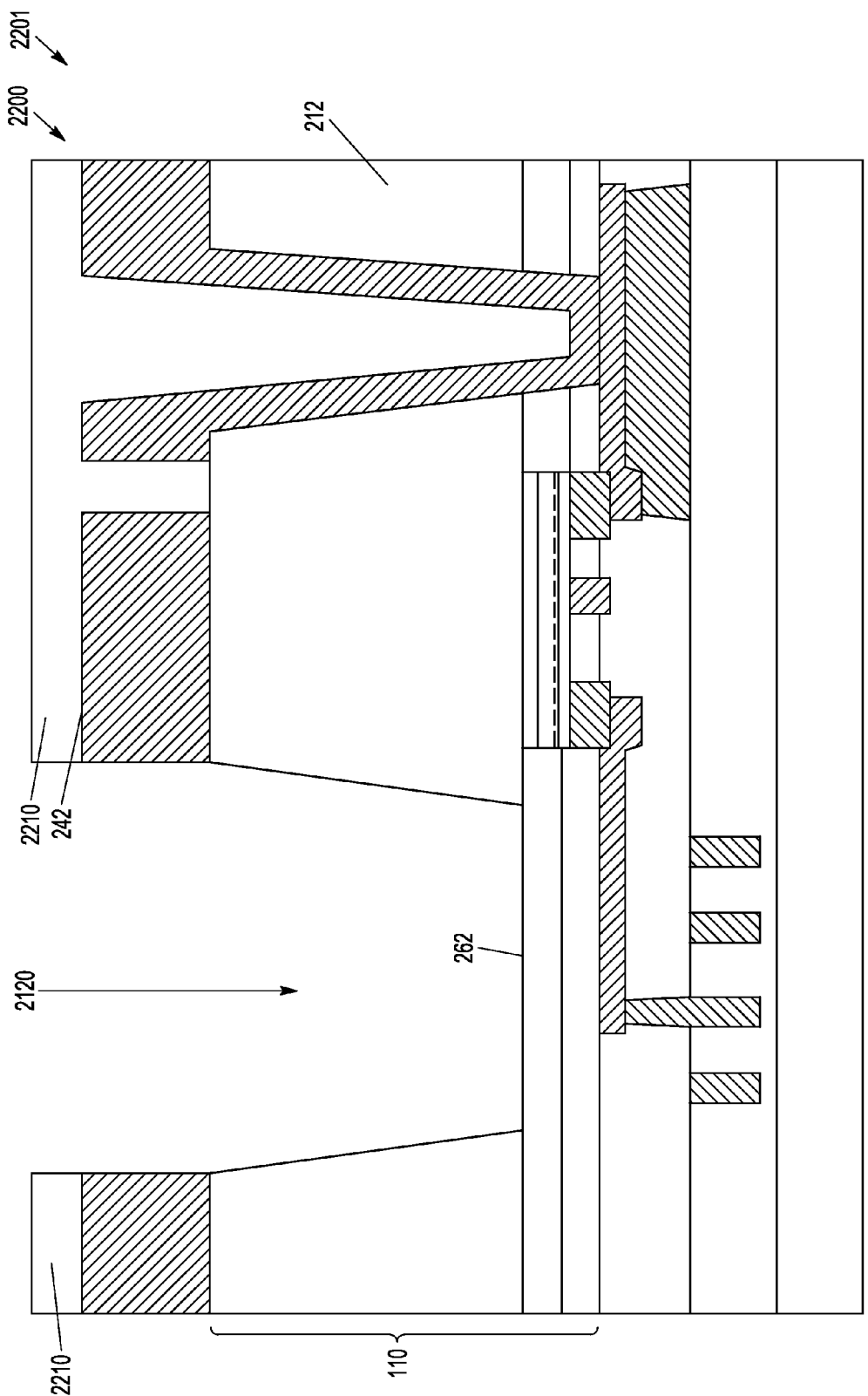

Referring now to FIG. 21 and step 2100, the method of fabricating device 100, includes removing backside masking material 2010, patterning a cavity masking layer 2110, and etching a cavity opening 2120. In an embodiment, cavity masking layer 2110 is disposed over bottom back metal layer surface 242 and over substrate surface 210 inside first conductor-less region(s) 150 of structure 2001 of FIG. 20. In an embodiment, and analogous to forming through wafer via 168 as discussed in conjunction with FIG. 19 and step 1900, cavity masking layer 2110 may include Al, Ni, Cr, photoresist, indium tin oxide (ITO) or other suitable materials. In an embodiment, plasma etching techniques may be used to create cavity opening 2120 in semiconductor substrate 110. These techniques may include reactive ion etching (RIE), inductively coupled plasma (ICP) etching, electron-cyclotron resonance (ECR) etching, or a combination of these techniques, though other suitable techniques may be used. The chemistries selected for the plasma etching techniques depend largely on the materials that comprise host substrate 212 and the semiconductor layers that may overlie host substrate 212. In an embodiment, the materials used to etch host substrate 212 include Si and F-based etch chemistries such as $SF_6$, $C_2F_6$, $CF_4$, combinations of these, or other suitable chemistries. For embodiments that include GaN in high resistivity semiconductor layer 222, Cl-based etch chemistries such as Cl, $BCl_3$, combinations of these, or other suitable chemistries may be used, as the GaN high resistivity semiconductor layer 222 serves as an etch stop for such etch chemistries. For both F-based and Cl-based etching, $O_2$ or Ar, or other suitable gases may be added to prevent polymer formation during etching. Structure 2101 results.

Figure 22:
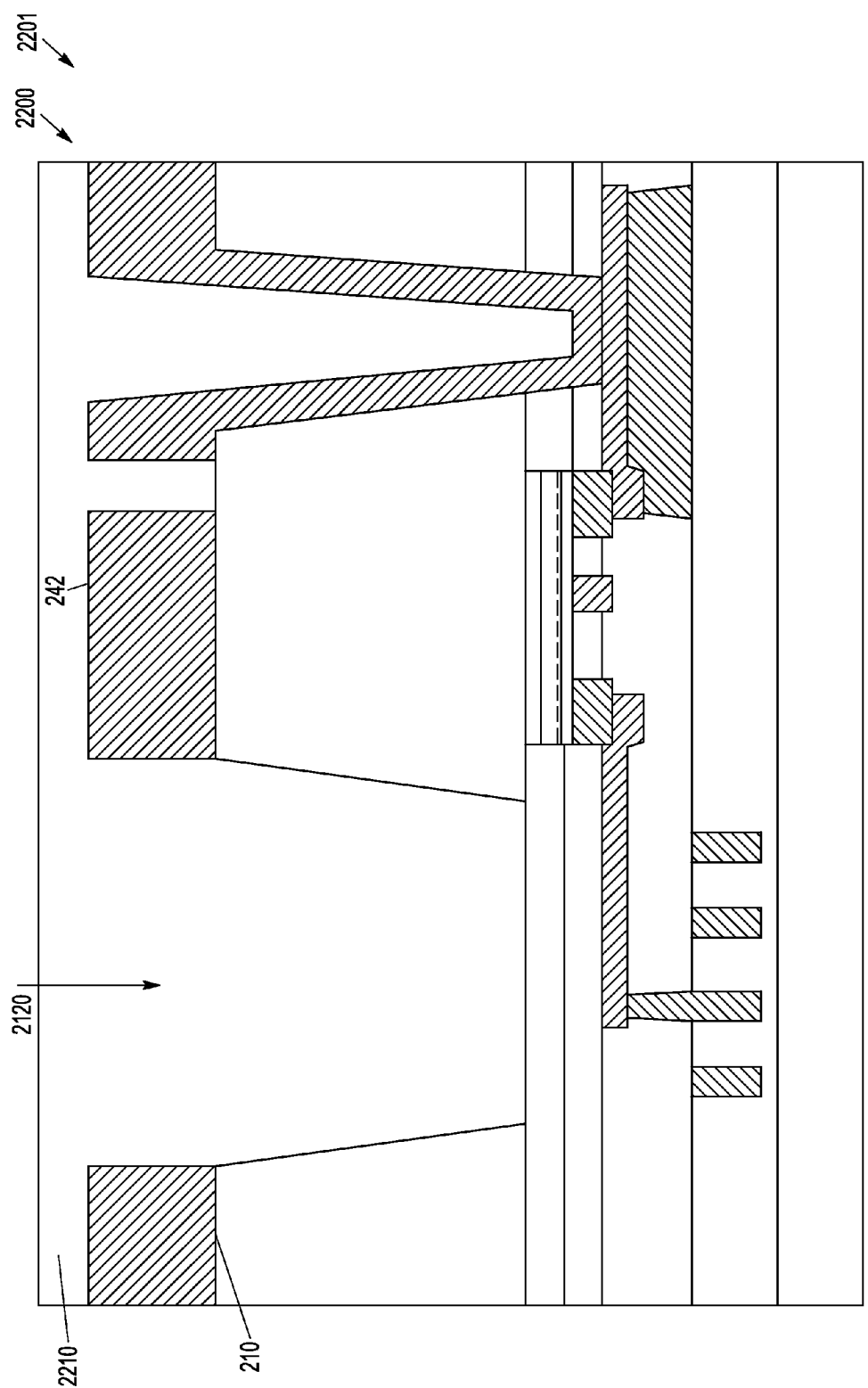

Referring now to FIG. 22 and step 2200, the method of fabricating device 100, includes removing cavity masking layer 2110 from structure 2101 of FIG. 21 and then disposing dielectric material 2210 over substrate bottom surface 210 within conductor-less regions 150 and surfaces 242 of the second conductive features 140, 142 and into cavity opening 2120. In an embodiment, dielectric material 2210 may include one or more of photo-imagable benzocyclobutene (BCB), non-photo-imagable BCB, polymide, epoxy, spin-on glass, or a combination of these or other suitable dielectric materials. In an embodiment, dielectric material 2210 may be deposited by spin-coating, spray coating, or other suitable technique. In an embodiment, dielectric material 2210 fills cavity opening 2120 and conductor-less region(s) 150. Structure 2201 results.

Figure 23:
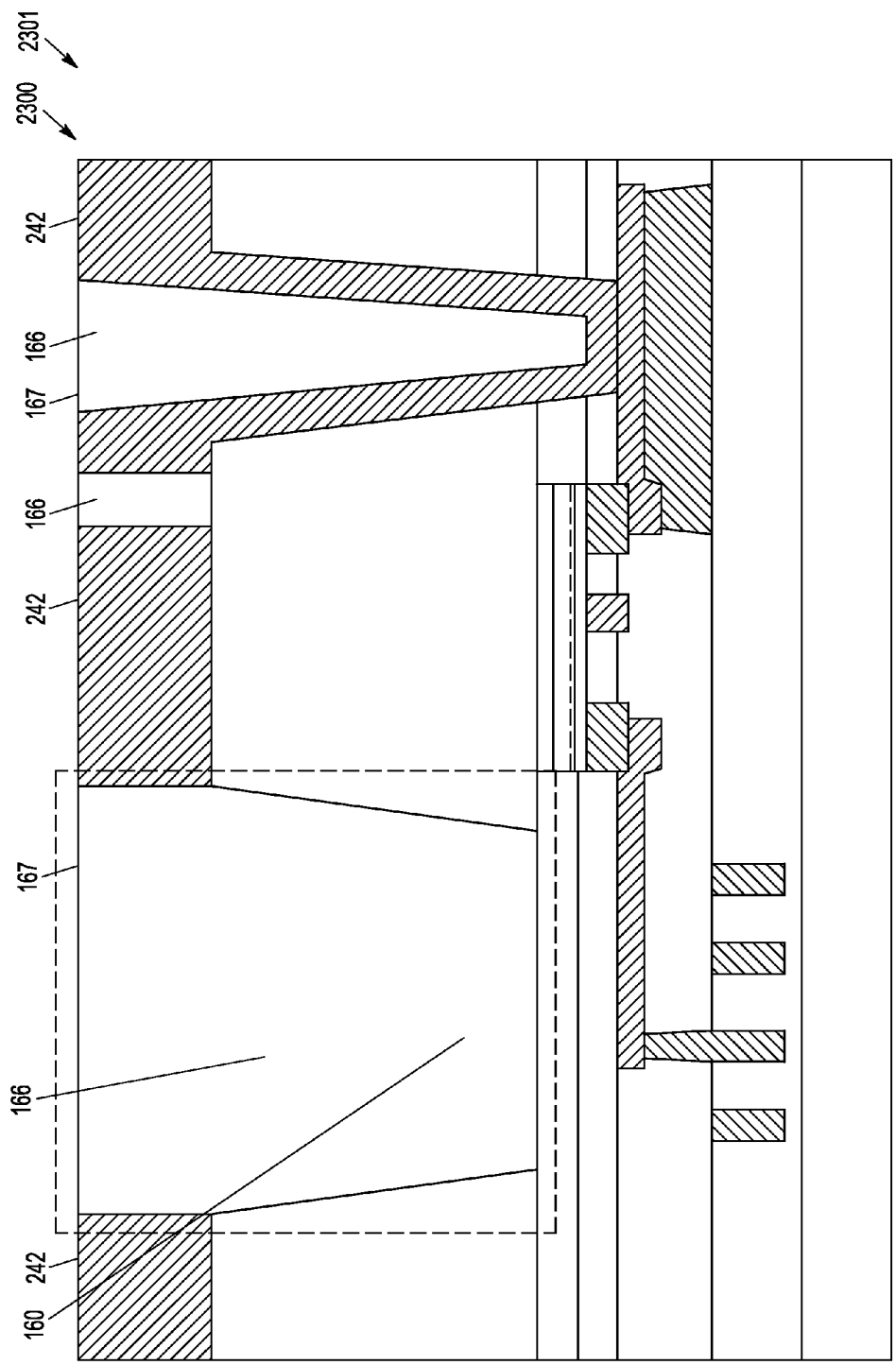

Referring now to FIG. 23 and step 2300, the method of fabricating device 100, includes removing excess dielectric material 2210 of structure 2201 of FIG. 22 to expose bottom back metal surface 242, and curing dielectric material 2210, to create dielectric medium 166 such that dielectric medium surface 167 is at or below the plane of bottom back metal surface 242. In an embodiment, photo-imagable BCB may be used. In this embodiment, excess dielectric material 2210 may be removed by flood exposing dielectric material 2210 with an appropriate light source such as a contact aligner or stepper and then using an appropriate developer to remove a portion of the dielectric material 2210 to a depth at the plane of bottom back metal surface 242. In an embodiment, after bottom back metal surface 242 has been exposed, dielectric material 2210 may be cured using a hard bake or other appropriate methods. In other embodiments where non photo imagable materials are used to create dielectric material 2210, excess dielectric material 2210 may be removed by dry etching dielectric material 2210 until bottom back metal surface 242 is exposed. Structure 2301 results.

Figure 24:
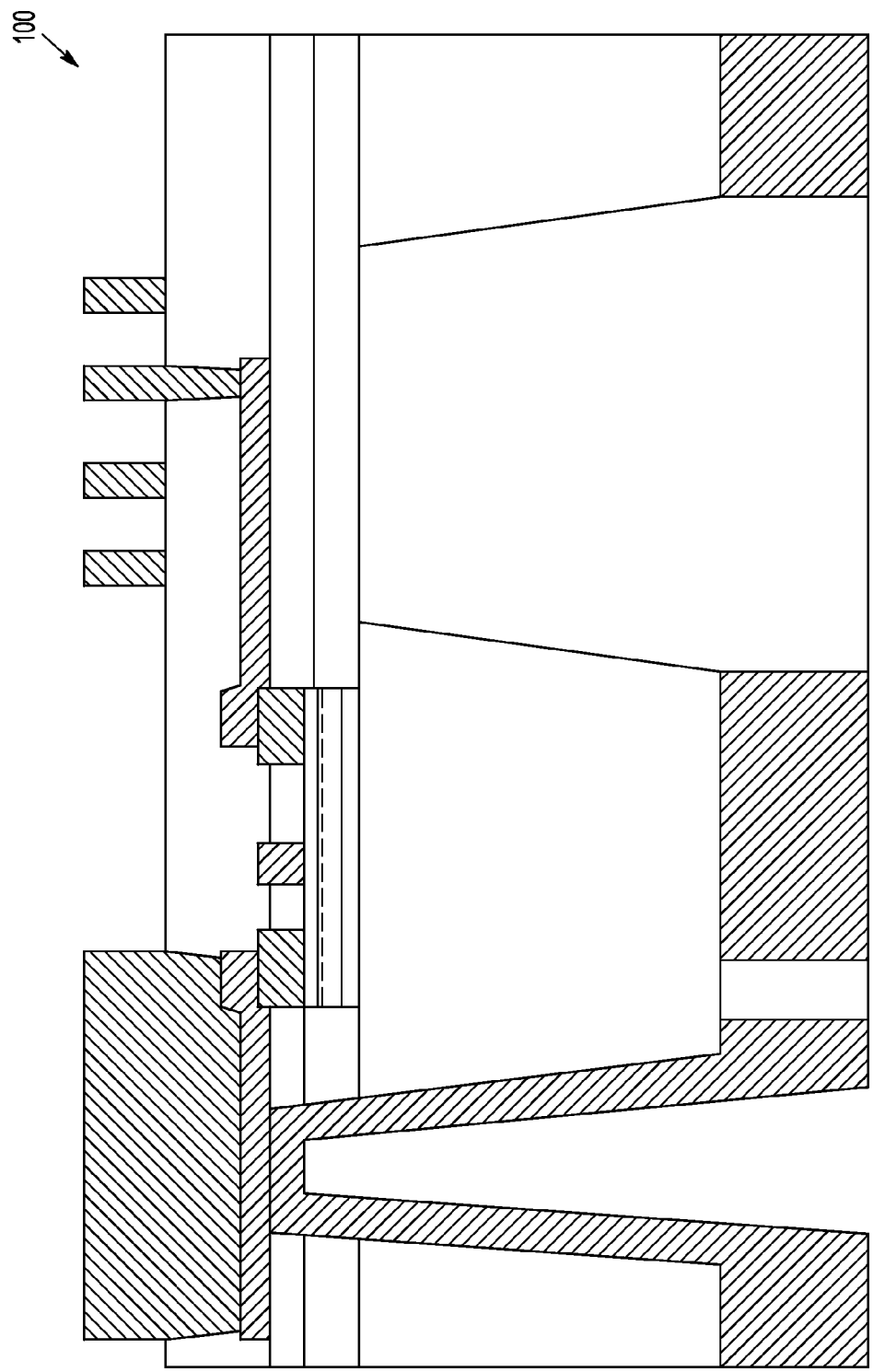

Referring now to FIG. 24 and step 2400, the method of fabricating device 100 includes immersing structure 2301 from FIG. 23 in suitable solvents that dissolve adhesive layer 1910, thus separating semiconductor substrate 110 from carrier wafer 1920 of FIG. 19 (not shown). The semiconductor wafer including device 100 may then be further processed to singulate device 100 from the wafer. The finished device 100 results.

By now it should be appreciated that a device and method of forming the device has been disclosed. An embodiment of the device includes a semiconductor substrate that includes a first substrate surface and a second substrate surface. In an embodiment, a transistor may be formed at the first substrate surface. The transistor includes a plurality of electrodes that include a control electrode, a first current-conducting electrode, and a second current-conducting electrode, according to an embodiment. In an embodiment, a first conductive feature may be formed over the first substrate surface and electrically coupled to one of the plurality of electrodes. In an embodiment, a second conductive feature may be coupled to the second substrate surface. In an embodiment, the second conductive feature may cover only a portion of the second substrate surface to define a first conductor-less region. A cavity may be formed within the first conductor-less region and extend into the semiconductor substrate, according to an embodiment. In an embodiment, the cavity may be at least partially defined by an inner cavity surface that is recessed into the semiconductor substrate from the second substrate surface. In an embodiment, the cavity may be vertically aligned with the first conductive feature. In an embodiment, a dielectric medium may be disposed within the cavity and have a dielectric constant less than a dielectric constant of the semiconductor substrate.

An embodiment of the inventive subject matter may further include an active region that includes the control electrode, the first current-conducting electrode, and the second current-conducting electrode. An embodiment may also include an isolation region that includes the first conductive feature. In an embodiment, the first conductive feature may be configured as a transmission line. In an embodiment, the first conductive feature may be configured as an inductor. In an embodiment, the semiconductor substrate may include a host substrate overlain by one or more semiconductor layers selected from gallium-polar group III-nitride semiconductor materials or nitrogen-polar group III-nitride semiconductor materials. In an embodiment, one or more of the semiconductor layers may include a buffer layer, a channel layer disposed over the buffer layer, and a barrier layer disposed over the channel layer, wherein top substrate surface is over the barrier. In an embodiment, the inner cavity surface may be at least partially defined by a lower surface of the buffer layer. In an embodiment, the host substrate may be selected from silicon carbide (SiC), sapphire, silicon, gallium nitride, aluminum nitride, diamond, boron nitride, poly-SiC, silicon on insulator, gallium arsenide, and indium phosphide. In an embodiment, the first current carrying electrode may be configured as a drain electrode, and the second current carrying electrode may be configured as a source electrode. In an embodiment, the dielectric medium may be selected from one or more of benzocyclobutene (BCB), polymide, epoxy, and spin-on glass.

In another aspect of the inventive subject matter, a device may include a semiconductor substrate with a first substrate surface and a second substrate surface. In an embodiment, the semiconductor substrate may include a host substrate and a group-III nitride semiconductor layer disposed over the host substrate. An embodiment may include a transistor that includes a drain contact, a source contact, and a gate electrode. The gate electrode may be formed over the semiconductor layer in an active region and may be electrically coupled to a channel, according to an embodiment. In an embodiment, an electrical signal applied to the gate electrode may control the electrical current flow in the channel between the drain contact and the source contact. In an embodiment, a first conductive feature formed over the first substrate surface may be in an isolation region wherein the first conductive feature is electrically coupled to a transistor electrode selected from the gate electrode, the drain contact, and the source contact. In an embodiment, a second conductive feature may be coupled to the second substrate surface, wherein the second conductive feature covers only a portion of the second substrate surface to define a first conductor-less region. In an embodiment, a cavity may be formed within the first conductor-less region and extend into the semiconductor substrate. In an embodiment, the cavity may be at least partially defined by an inner cavity surface that is recessed into the semiconductor substrate from the second substrate surface, and the inner cavity surface may be vertically aligned below the first conductive feature. In an embodiment, a dielectric medium disposed within the cavity may have a dielectric constant that is less than a dielectric constant of the host substrate. In an embodiment, the host substrate may be selected from silicon carbide (SiC), sapphire, silicon, gallium nitride, aluminum nitride, diamond, boron nitride, poly-SiC, silicon on insulator, gallium arsenide, and indium phosphide. In an embodiment, the first conductive feature may include an inductor. In an embodiment, the first conductive feature may include a transmission line.

In a further aspect of the inventive subject matter, a method for forming a device has been disclosed. In an embodiment, the method may include the steps of providing a semiconductor substrate that includes a first substrate surface and a second substrate surface, and forming a transistor at the first substrate surface. In an embodiment, forming the transistor may include forming a control electrode, a first current-conducting electrode, and a second current-conducting electrode over the first substrate surface. In an embodiment, the method may include forming a first conductive feature over the first substrate surface and electrically coupling the first conductive feature to one of the control electrode, the first current-conducting electrode, or the second current conducting electrode. In an embodiment, the method may include forming a second conductive feature coupled to the second substrate surface. In an embodiment, the second conductive region may cover only a portion of the second substrate surface to define a first conductor-less region. In an embodiment, the method may include forming a cavity within the first conductor-less region that includes an upper cavity surface, wherein the upper cavity surface is above the second substrate surface and directly below the first conductive feature. In an embodiment, the method may include forming a dielectric medium within the cavity having a dielectric constant less than a dielectric constant of the semiconductor substrate.

In an embodiment, the method may include forming an active region that includes the control electrode, the first current-conducting electrode, and the second current-conducting electrode. The method may include forming an isolation region that includes the first conductive feature, according to an embodiment. In an embodiment, the method may include forming the semiconductor substrate by overlying a host substrate with one or more semiconductor layers selected from Ga-polar group III-nitride semiconductors or N-polar group III-nitride semiconductors. In an embodiment, etching the host substrate may include using a dry etch technique. In an embodiment, forming the dielectric medium within the cavity may include disposing a dielectric medium selected from benzocyclobutene (BCB), polymide, epoxy, and spin-on glass into the cavity.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected"

means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   a semiconductor substrate that includes a first substrate surface and a second substrate surface;
   a transistor formed at the first substrate surface, wherein the transistor comprises a plurality of electrodes that include a control electrode, a first current-conducting electrode, and a second current-conducting electrode;
   a first conductive feature formed over the first substrate surface and electrically coupled to one of the plurality of electrodes;
   a second conductive feature coupled to the second substrate surface, wherein the second conductive feature includes an opening through which a portion of the second substrate surface is exposed to define a first conductor-less region along the second substrate surface;
   a cavity within the first conductor-less region and extending into the semiconductor substrate, wherein the cavity is at least partially defined by an inner cavity surface that is recessed into the semiconductor substrate from the second substrate surface and is vertically aligned with the first conductive feature; and
   a dielectric medium disposed within the cavity and in contact with the inner cavity surface that terminates on a dielectric medium surface parallel to the second substrate surface, the dielectric medium having a dielectric constant less than a dielectric constant of the semiconductor substrate, wherein the dielectric medium surface does not contact a conductive material.

2. The device of claim 1, further comprising an active region that includes the control electrode, the first current-conducting electrode, and the second current-conducting electrode.

3. The device of claim 1, further comprising an isolation region that includes the first conductive feature.

4. The device of claim 1, wherein the first conductive feature is configured as a transmission line.

5. The device of claim 1, wherein the first conductive feature is configured as an inductor.

6. The device of claim 1, wherein the semiconductor substrate further comprises a host substrate overlain by one or more semiconductor layers selected from gallium-polar group III-nitride semiconductor materials or nitrogen-polar group III-nitride semiconductor materials.

7. The device of claim 6, wherein the one or more semiconductor layers comprise:
   a buffer layer;
   a channel layer disposed over the buffer layer; and
   a barrier layer disposed over the channel layer, wherein top substrate surface is over the barrier.

8. The device of claim 7, wherein the inner cavity surface is at least partially defined by a lower surface of the buffer layer.

9. The device of claim 6, wherein the host substrate is selected from silicon carbide (SiC), sapphire, silicon, gallium nitride, aluminum nitride, diamond, boron nitride, poly-SiC, silicon on insulator, gallium arsenide, and indium phosphide.

10. The device of claim 1, wherein the first current carrying electrode is configured as a drain electrode, and the second current carrying electrode is configured as a source electrode.

11. The device of claim 1, wherein the dielectric medium is selected from benzocyclobutene (BCB), polymide, epoxy, and spin-on glass.

12. A device comprising:
   a semiconductor substrate with a first substrate surface and a second substrate surface, wherein the semiconductor substrate includes a host substrate and a group-III nitride semiconductor layer disposed over the host substrate;
   a transistor comprising a drain contact, a source contact, and a gate electrode, wherein the gate electrode is formed over the semiconductor layer in an active region and is electrically coupled to a channel, and wherein an electrical signal applied to the gate electrode controls electrical current flow in the channel between the drain contact and the source contact;
   a first conductive feature formed over the first substrate surface in an isolation region wherein the first conductive feature is electrically coupled to a transistor electrode selected from the gate electrode, the drain contact, and the source contact;
   a second conductive feature coupled to the second substrate surface, wherein the second conductive feature includes an opening through which a portion of the second substrate surface is exposed to define a first conductor-less region along the second substrate surface;
   a cavity within the first conductor-less region and extending into the semiconductor substrate, wherein the cavity is at least partially defined by an inner cavity surface that is recessed into the semiconductor substrate from the second substrate surface, and the inner cavity surface is vertically aligned below the first conductive feature; and
   a dielectric medium disposed within the cavity and in contact with the inner cavity surface that terminates on a dielectric medium surface parallel to the second substrate surface, the dielectric medium having a dielectric constant less than a dielectric constant of the semiconductor substrate, wherein the dielectric medium surface does not contact a conductive material.

13. The device of claim 12, wherein the host substrate is selected from silicon carbide (SiC), sapphire, silicon, gallium nitride, aluminum nitride, diamond, boron nitride, poly-SiC, silicon on insulator, gallium arsenide, and indium phosphide.

14. The device of claim 12, wherein the first conductive feature comprises an inductor.

15. The device of claim 12, wherein the first conductive feature comprises a transmission line.

\* \* \* \* \*